US006836960B2

(12) United States Patent
Hamasaki et al.

(10) Patent No.: US 6,836,960 B2
(45) Date of Patent: Jan. 4, 2005

(54) BOARD TRANSFER APPARATUS, BOARD TRANSFER METHOD, AND COMPONENT MOUNTING APPARATUS

(75) Inventors: Kurayasu Hamasaki, Neyagawa (JP); Makito Seno, Hirakata (JP); Kunio Sakurai, Toyonaka (JP); Hiroshi Ota, Katano (JP); Akiko Katsui, Neyagawa (JP); Yoshiyuki Nagai, Toyonaka (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 394 days.

(21) Appl. No.: 09/853,681

(22) Filed: May 14, 2001

(65) Prior Publication Data

US 2002/0053132 A1 May 9, 2002

(30) Foreign Application Priority Data

May 15, 2000 (JP) .................................. 2000-141611
May 22, 2000 (JP) .................................. 2000-149773

(51) Int. Cl.$^7$ ................................................ H05K 3/30
(52) U.S. Cl. .......................... 29/832; 29/740; 29/784; 29/742; 198/465.1
(58) Field of Search ..................... 29/832, 740, 786, 29/760, 732, 830, 831, 833, 429, 430, 741, 742, 784; 198/345.3, 346.2, 465.1

(56) References Cited

U.S. PATENT DOCUMENTS 3,543,392 A * 12/1970 Perry et al. .................. 29/563
4,787,143 A * 11/1988 Yagi et al. ................... 29/833
5,899,446 A * 5/1999 Thompson ................... 269/55
6,145,648 A * 11/2000 Teichman et al. .......... 198/468.6
6,257,391 B1 * 7/2001 Nishimori et al. .......... 198/358
6,272,743 B1 * 8/2001 Nishimori et al. ............ 29/832
6,453,548 B1 * 9/2002 Hidese ......................... 29/832
6,643,917 B1 * 11/2003 Gieskes ........................ 29/740

FOREIGN PATENT DOCUMENTS

JP          10-256785          9/1998

* cited by examiner

Primary Examiner—David P. Bryant
Assistant Examiner—Stephen Kenny
(74) Attorney, Agent, or Firm—Wenderoth, Lind & Ponack, L.L.P.

(57) ABSTRACT

The present invention has for its object to provide an apparatus and a method for transferring boards, and a component mounting apparatus whereby a production efficiency can be improved in accordance with types of boards to be produced. For accomplishing this object, there are arranged a shift device capable of moving a mounted board from a process-finished board transfer path to an unprocessed board transfer path, a controller for controlling this moving, and an identifying device. This arrangement enables switching of a method of transferring boards in accordance with types of boards to be produced, and controlling supply of boards to the component mounting apparatus, so that production efficiency is improved in accordance with types of boards.

21 Claims, 16 Drawing Sheets

BOARD TRANSFER APPARATUS, BOARD TRANSFER METHOD, AND COMPONENT MOUNTING APPARATUS

TECHNICAL FIELD

The present invention relates to a board transferring apparatus for transferring boards, e.g., printed boards or the like to a component mounting apparatus which mounts components, e.g., electronic components or the like to the boards, a board transfer method performed by the board transferring apparatus, and a component mounting apparatus used with the board transferring apparatus.

BACKGROUND ART

In accordance with widespread use of lead-wire less electronic components, namely, so-called chip components, components vary in shape and size. Since an electronic circuit is constituted by combining such electronic components, a much higher speed and a high reliability are demanded to be secured for electronic component mounting apparatuses which fix the electronic components to printed boards.

A plurality of the electronic component mounting apparatuses of the type referred to above are generally used in order to mount the electronic components to many printed boards. Since a loading operation of the printed board takes place for each component mounting apparatus when a plurality of the component mounting apparatuses are employed for one board transfer path, there is a problem that a degree of increase in production efficiency lowers as compared with a degree of increase in a number of apparatuses to be set. Suppose, for example, that a board loading time at each component mounting apparatus is 4 seconds and a mounting time of all electronic components is 10 seconds, then one component mounting apparatus requires 14 (10+4) seconds and two component mounting apparatuses require 9 (10/2)+4) seconds to produce one complete board.

The applicant of the present invention has disclosed an invention as a technique for solving the above problem in a publication of unexamined patent application of JP, 10-256785, A. A constitution and an operation of a printed board transferring apparatus disclosed in the published application of the above JP, 10-256785, A will be described below with reference to FIG. 9.

Roughly speaking, a component mounting apparatus 1 shown in FIG. 9 comprises two mounting parts 2A, 2B arranged in series, moving devices 3A, 3B for boards to be mounted, which are set respectively to the mounting parts 2A, 2B, a carry-in device 4 for supplying unmounted boards 7 to the mounting parts 2A, 2B, and a carry-out device 5 for transferring mounted boards 8 sent out from the mounting parts 2A, 2B. Although the carry-in device 4 and the carry-out device 5 are illustrated as if arranged in parallel in the same plane in FIG. 9 to facilitate a graphic representation and description, and moreover understanding, the carry-out device 5 and the carry-in device 4 are actually placed in an overlapping manner so as to be arranged on upper and lower sides to make the apparatus compact.

The moving devices 3A, 3B for boards to be mounted have loader conveyors 31A, 31B which reciprocate between the carry-in device 4 and the mounting parts 2A, 2B to supply unmounted boards 7 from the carry-in device 4 to the mounting parts 2A, 2B, and unloader conveyors 32A, 32B which reciprocate between the mounting parts 2A, 2B and the carry-out device 5 to send out mounted boards 8 from the mounting parts 2A, 2B to the carry-out device 5. Since the carry-in device 4 and the carry-out device 5 are set in an overlapping manner in an up-down direction as mentioned above, the loader conveyors 31A, 31B move slantwise along a first direction 10 orthogonal to a board transfer direction 9, while the unloader conveyors 32A, 32B, positioned at an equal height as that of the carry-out device 5, move at this height in a second direction 11.

The component mounting apparatus 1 constituted as above operates in a manner to be described below.

When the mounting part 2A is not operating, an unmounted board 7 transferred by the carry-in device 4 from upstream equipment (not shown) is carried by the loader conveyor 31A into the mounting part 2A, and then all electronic components are mounted onto the unmounted board 7 at the mounting part 2A. A mounted board 8 with the components mounted thereon is carried by the unloader conveyor 32A to the carry-out device 5 and then transferred by the carry-out device 5 to equipment of a next process.

If the mounting part 2A is operating, the unmounted board 7 is transferred by the carry-in device 4, to pass a section of the mounting part 2A, to the mounting part 2B. When the mounting part 2B is not operating at this time, the unmounted board 7 is carried into the mounting part 2B by the loader conveyor 31B, and then all electronic components are mounted onto the unmounted board 7 by the mounting part 2B. A mounted board 8 with the components mounted thereon is sent out by the unloader conveyor 32B to the carry-out device 5 and transferred by the carry-out device 5 to next process equipment.

In producing one mounted board 8 in the component mounting apparatus 1 as described above, a loading operation of boards to the mounting parts 2A, 2B is completed at a time irrespective of a number of mounting parts. In other words, boards 7 can be supplied independently to each of the mounting parts 2A, 2B because of presence of the carry-in device 4 and the carry-out device 5. Given, for instance, that a board loading time and a mounting time at each of the mounting parts 2A, 2B are 4 seconds and 10 seconds, respectively, and since boards 7 can be supplied and equipped with components at the same time at the mounting parts 2A, 2B, a line Tact necessary for producing one finished board becomes (10+4)/2, i.e. 7 seconds, and shortened by 2 seconds in comparison with the earlier-mentioned 9 seconds.

The invention disclosed by the published application of the above JP, 10-256785, A is aimed to provide a board transfer method whereby a production efficiency of an electronic component mounting apparatus can be improved by shortening a loading time per board sent out from component mounting apparatus 1 on an understanding that each mounting part 2A, 2B can mount all necessary electronic components for producing one mounted board 8. However, as in recent years, a production form, in which a volume of production is relatively low and there are a wide variety of products to be made, is frequently practiced. Therefore, a condition that all of electronic components are mounted by one mounting part without fail is difficult to maintain.

Concretely, in a case, for example, where a number of types of electronic components necessary for manufacturing one mounted board 8 is more than a number of types of components which one mounting part can provide, all electronic components cannot be mounted by the one mounting part. In such a case as this, there is a problem in that it is necessary to set another component mounting apparatus, having another constitution, in order to mount remaining components.

The present invention is devised to solve the above problems and has for its object to provide a board transferring apparatus and method, and a component mounting apparatus which can improve a production efficiency in accordance with types of boards to be produced.

SUMMARY OF THE INVENTION

In accomplishing the above and other objects, a board transferring apparatus provided according to a first aspect of the present invention transfers boards between the apparatus and a component-mounted board production apparatus, which comprises:

an unprocessed board transfer unit including an unprocessed board transfer path along which an unprocessed board, as a board not yet processed by the component-mounted board production apparatus, is transferred, and an unprocessed board carry-in device which moves between the unprocessed board transfer path and the component-mounted board production apparatus, thereby carrying the unprocessed board into the component-mounted board production apparatus;

a process-finished board send-out unit including a process-finished board transfer path along which a process-finished board, as a board processed by the component-mounted board production apparatus, is transferred, for carrying the process-finished board out from the component-mounted board production apparatus by moving between the process-finished board transfer path and the component-mounted board production apparatus; and a shift device which moves between the unprocessed board transfer path and the process-finished board transfer path for shifting a board between the unprocessed board transfer path and the process-finished board transfer path.

At least one shift device can be equipped when a plurality of component-mounted board production apparatuses are arranged in series in a transfer direction of an unprocessed board and a process-finished board.

The board transferring apparatus may further comprise a controller for controlling operations of the unprocessed board transfer unit, the process-finished board transfer unit and the shift device.

In a case where a plurality of component-mounted board production apparatuses, for executing different processes, are arranged along the transfer direction of the unprocessed board and the process-finished board, the shift device may be disposed between a first component-mounted board production apparatus and a second component-mounted board production apparatus for executing mutually different processes, while the controller can control the shift device to shift process-finished boards carried out from the first component-mounted board production apparatus to the process-finished board transfer path, to the unprocessed board transfer path.

The controller can control operations of the unprocessed board transfer unit, the process-finished board transfer unit and the shift device on a basis of an arrangement of the component-mounted board production apparatus along the transfer direction and a processing program to be executed for boards.

According to a second aspect of the present invention provided is a board transfer method which comprises:

carrying an unprocessed board, as a board not processed by a component-mounted board production apparatus, from an unprocessed board transfer path into the component-mounted board production apparatus;

sending out a process-finished board, as a processed board, to a process-finished board transfer path after being processed in the component-mounted board production apparatus; and moving the process-finished board from the process-finished board transfer path to the unprocessed board transfer path.

A component mounting apparatus according to a third aspect of the present invention comprises the board transferring apparatus of the first aspect.

According to the board transferring apparatus of the first aspect, the board transfer method of the second aspect, and the component mounting apparatus of the third aspect of the present invention, since the shift device is provided, it is possible to supply an unprocessed board from the unprocessed board transfer path to the component-mounted board production apparatus, process the unprocessed board in the component-mounted board production apparatus and transport a process-finished board, sent out to the process-finished board transfer path, to the unprocessed board transfer path again, such that the process-finished board can be supplied from the unprocessed board transfer path to another component-mounted board production apparatus. A production efficiency can be improved in accordance with types of boards to be produced.

A plurality of component-mounted board production apparatuses are arranged in series in the transfer direction together with the controller which controls the shift device to transport a process-finished board, sent out from a first component-mounted board production apparatus to the process-finished board transfer path, to the unprocessed board transfer path. Therefore, various production forms for boards can be met without changing a layout in a factory including a layout of a board production line and incidental facilities, and the like. Production efficiency can hence be improved in accordance with types of boards to be produced.

Further, the controller is adapted to control operations of the unprocessed board transfer unit, the process-finished board transfer unit, and the shift device based on an arrangement of the component-mounted board production apparatus and a processing program to be executed for the boards, whereby production efficiency can be improved in accordance with kinds of boards to be produced.

According to a board transferring apparatus according to a fourth aspect of the present invention for transferring boards on a board transfer path and between the board transfer path and a component-mounted board production apparatus while the component-mounted board production apparatus is disposed along the board transfer path where boards are transferred in a transfer direction, the board transferring apparatus comprises:

a board carry-in unit which moves between the board transfer path and the component-mounted board production apparatus, thereby carrying a board into the component-mounted board production apparatus;

a board send-out unit which moves between the board transfer path and the component-mounted board production apparatus, thereby sending the board from the component-mounted board production apparatus to the board transfer path;

an identifying device disposed on the board transfer path for identifying a carry-in propriety display part on the board indicative of whether or not the board can be carried into the component-mounted board production apparatus; and a controller for determining whether or not the board is to be carried into the component-mounted board production apparatus on a basis of an identification result of the carry-in propriety display part identified by the identifying device, and controlling an operation of the board carry-in unit.

When the controller determines that the board is to be carried into the component-mounted board production apparatus on the basis of the identification result, the controller is adapted to have the board carry-in unit carry the board into the component-mounted board production apparatus, have the board processed by the component-mounted board production apparatus and have this processed board sent by the board send-out unit to the board transfer path.

When a plurality of component-mounted board production apparatuses are arranged in series along the board transfer path, with an identifying device being provided corresponding to each of the component-mounted board production apparatuses, the controller determines on a basis of an identification result whether or not an identified board is to be carried into one of the component-mounted board production apparatuses and can allow the identified board to be transferred along the board transfer path in the transfer direction when determining that the identified board is not to be carried into the component-mounted board production apparatus.

A recognizing device may further be included in the board transferring apparatus, which is disposed corresponding to a component-mounted board production apparatus arranged at a trail end in the transfer direction, from among a plurality of component-mounted board production apparatuses, for recognizing a propriety of processing by the component-mounted board production apparatuses for a board transferred along the board transfer path.

A carry-in propriety display part can be a mark preliminarily applied to the board.

According to a fifth aspect of the present invention provided is a board transfer method for transferring boards to a board transfer path, and between the board transfer path and a component-mounted board production apparatus disposed along the board transfer path, wherein the boards are transferred in a transfer direction, which comprises:

identifying a carry-in propriety display part of a board transferred along the board transfer path; and determining, on a basis of an identification result, whether or not the board is to be carried into the component-mounted board production apparatus.

A component mounting apparatus according to a sixth aspect of the present invention is equipped with the board transferring apparatus of the fourth aspect.

According to the board transferring apparatus of the fourth aspect, the board transfer method of the fifth aspect, and the component mounting apparatus of the sixth aspect of the invention, since the identifying device and the controller are included, it is possible to determine whether or not a board can be moved to the component-mounted board production apparatus and, on a basis of this determination result, whether the board is to be supplied from the board transfer path to the component-mounted board production apparatus. Thus, a production efficiency is improved in accordance with types of boards to be produced.

When a plurality of component-mounted board production apparatuses are arranged in series in the transfer direction, with an identifying device being provided corresponding to each component-mounted board production apparatus, the controller determines a carry-in propriety for each component-mounted board production apparatus and controls supply of boards, on a basis of this determination result, from the board transfer path to each component-mounted board production apparatus. Various production forms for boards can be met without greatly changing a layout in a factory including a layout of a board production line and incidental facilities, and the like. Production efficiency can be improved in accordance with kinds of boards to be produced.

A recognizing device is installed corresponding to a component-mounted board production apparatus at a trail end when a plurality of component-mounted board production apparatuses are arranged, so that propriety of processing for each component-mounted board production apparatus is recognized by the recognizing device. Therefore, boards can be prevented from being sent out in a state without being processed at a next component-mounted board protection apparatus.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
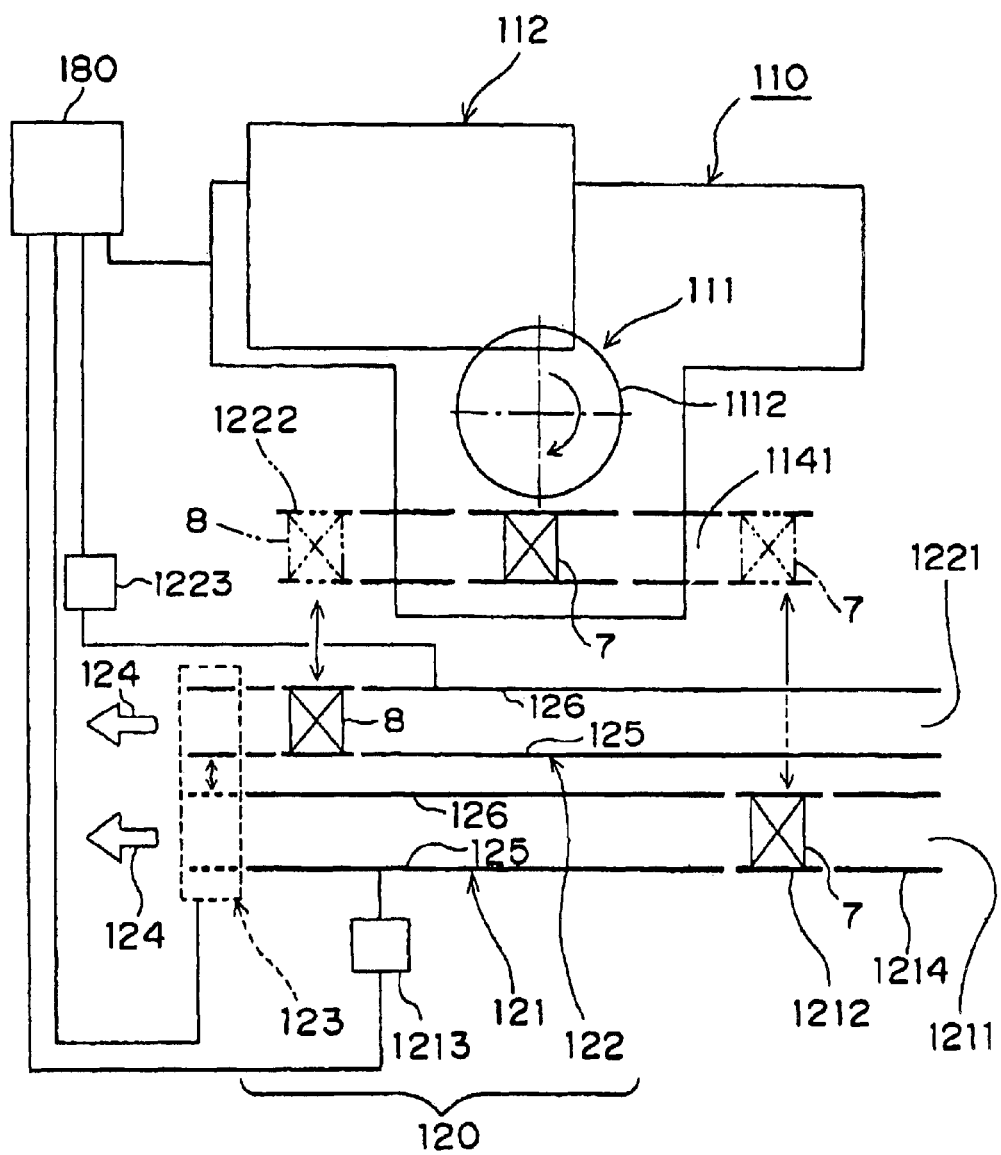
FIG. 1 is a diagram showing a constitution of a component mounting apparatus according to a first embodiment of the present invention.

A board transferring apparatus, a board transfer method executed by the board transferring apparatus, and a component mounting apparatus equipped with the board transferring apparatus which are embodiments of the present invention will be described hereinbelow with reference to the drawings. It is to be noted that like parts are designated by like reference numerals throughout the drawings.

A printed board will be given as an example of a board, that is transfer object, in the board transferring apparatus in first and second embodiments below, and a component supply/mounting machine for supplying and mounting electronic components, as an example of components, onto the printed board will be exemplified as one of devices having functions exerted by a component-mounted board production apparatus attached to the board transferring apparatus in the first and second embodiments. However, the component-mounted board production apparatus and the board are not limited to the above and, the component-mounted board production apparatus can be, e.g., a printing apparatus for printing a solder paste to boards, a reflow apparatus for melting the solder paste to thereby solder components, or the like, and eventually the board can be, e.g., a board before having the solder paste printed, a board with the solder paste and components set, or the like. It is to be noted that, while the printing apparatus and the reflow apparatus are often normally constituted singly, the first and the second embodiments to be described below are directed to an electronic component mounting equipment which employs such plural apparatus.

First Embodiment

Figure 2:
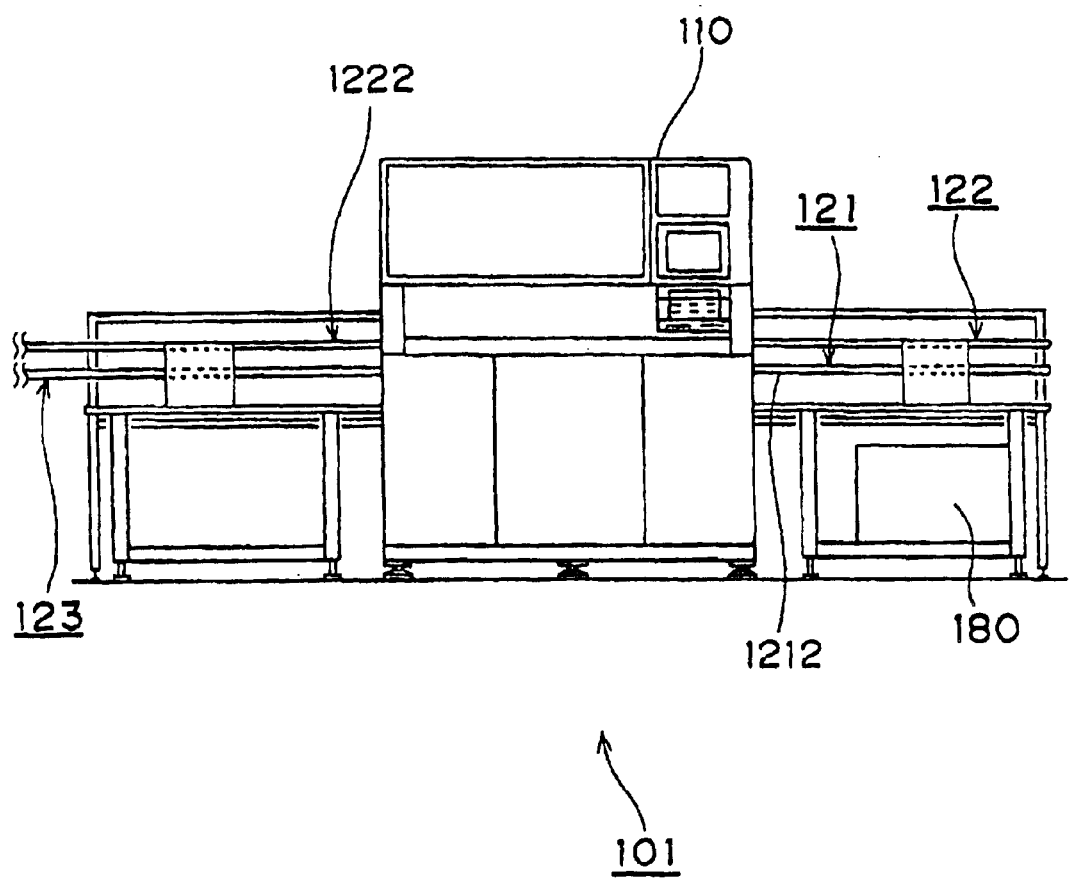
FIG. 2 is a front view of the component mounting apparatus shown in FIG. 1.

In FIGS. 1 and 2 is shown a component mounting apparatus 101 which is provided with a board transferring apparatus 120 according to the present first embodiment, and which also includes a component supply/mounting machine 110 for receiving a supply of unmounted boards 7 from the board transferring apparatus 120, mounting components onto these boards and then sending out a mounted board 8 with electronic components mounted thereon, after this mounting, to the board transferring apparatus 120, and a controller 180 for controlling operations of the board transferring apparatus 120 and the component supply/mounting machine 110. In the present first embodiment, an example of unprocessed boards corresponds to the above unmounted board 7, and an example of process-finished boards corresponds to the above mounted board 8. In unmounted boards 7 are included one having one circuit exerting one function formed on one side, and one having a plurality of circuits each exerting the same function formed on one side.

Although the controller 180 is indicated to be separately arranged from the component mounting apparatus in FIG. 1, the controller may be arranged inside the component mounting apparatus or can be arranged for every part constituting the component mounting apparatus.

Figure 3:
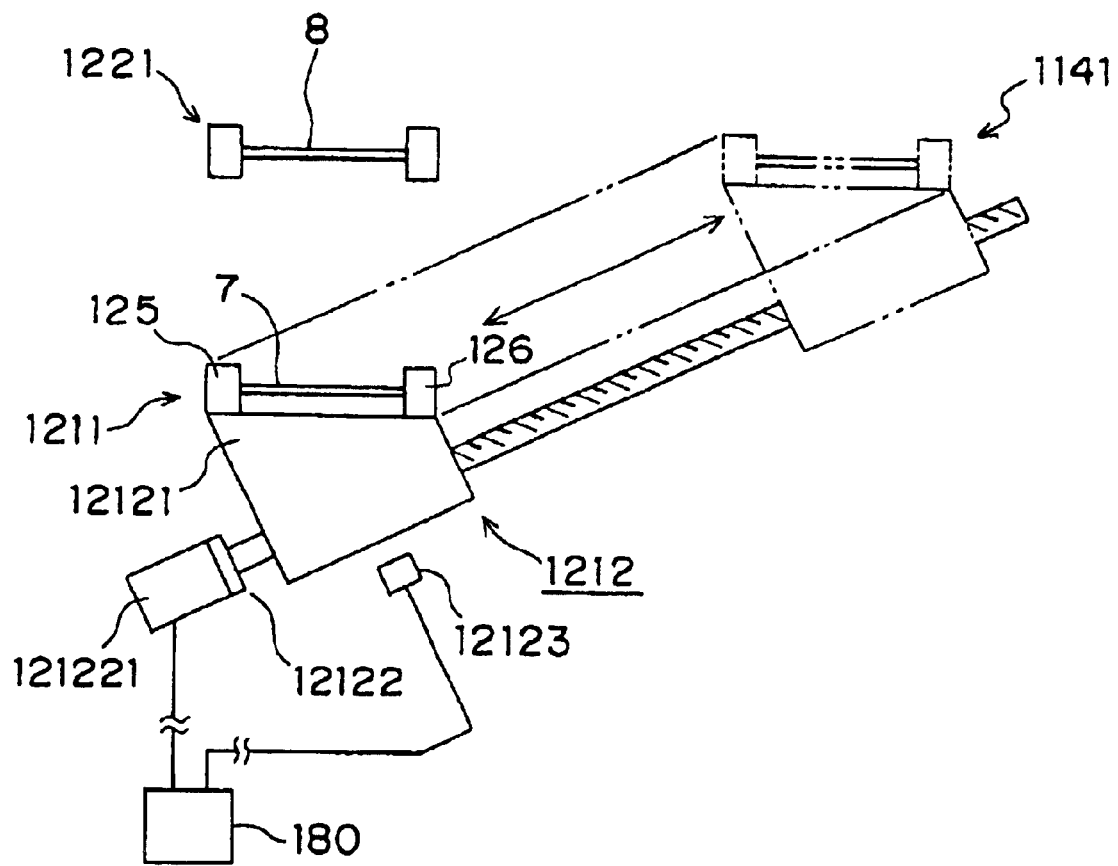
FIG. 3 is a diagram showing structure of an unprocessed board carry-in device included in the component mounting apparatus shown in FIG. 1.
Figure 7:
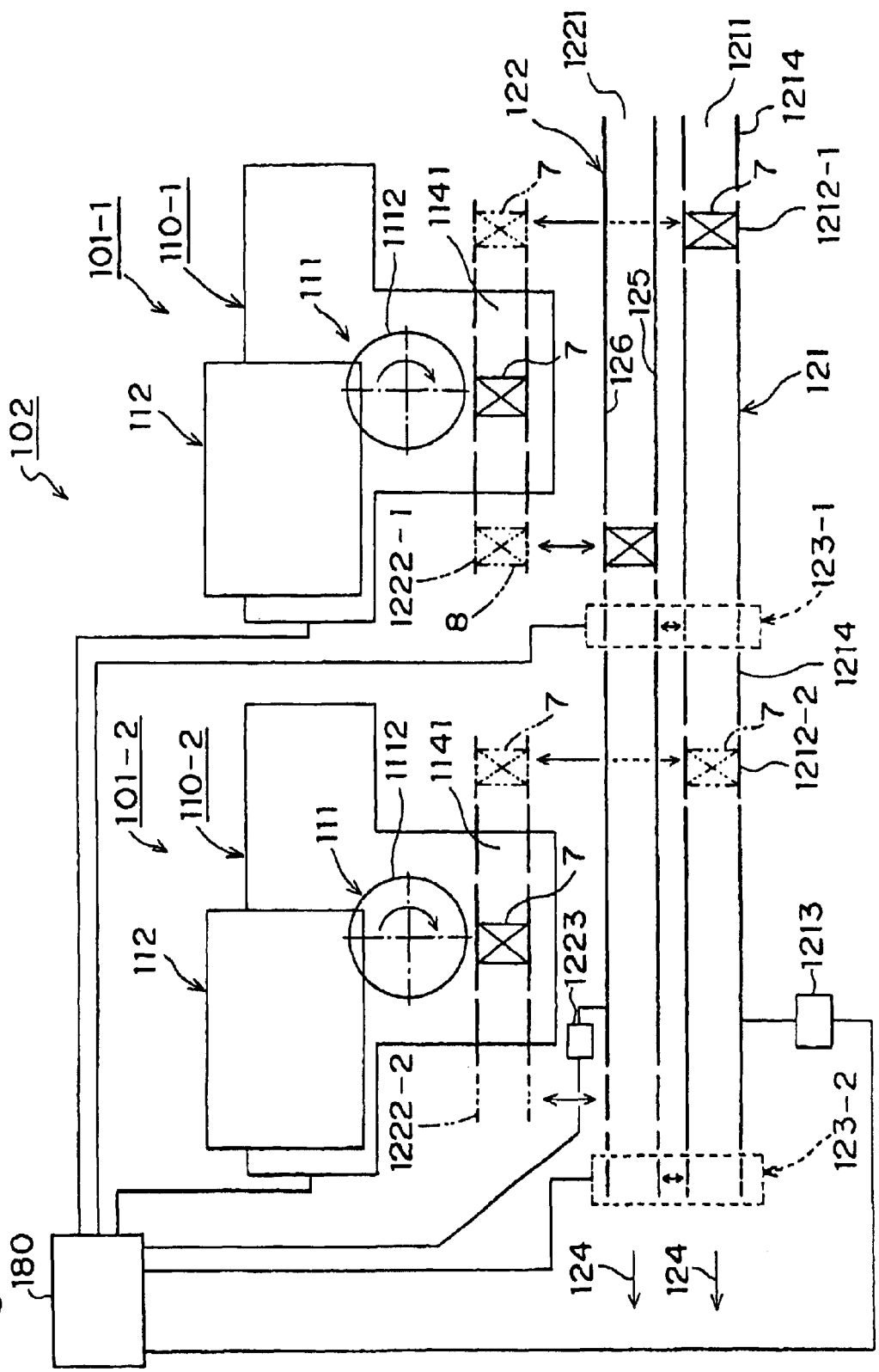
FIG. 7 is a diagram of a component mounting apparatus comprising two component mounting apparatuses of FIG. 1 arranged in series.
Figure 8:
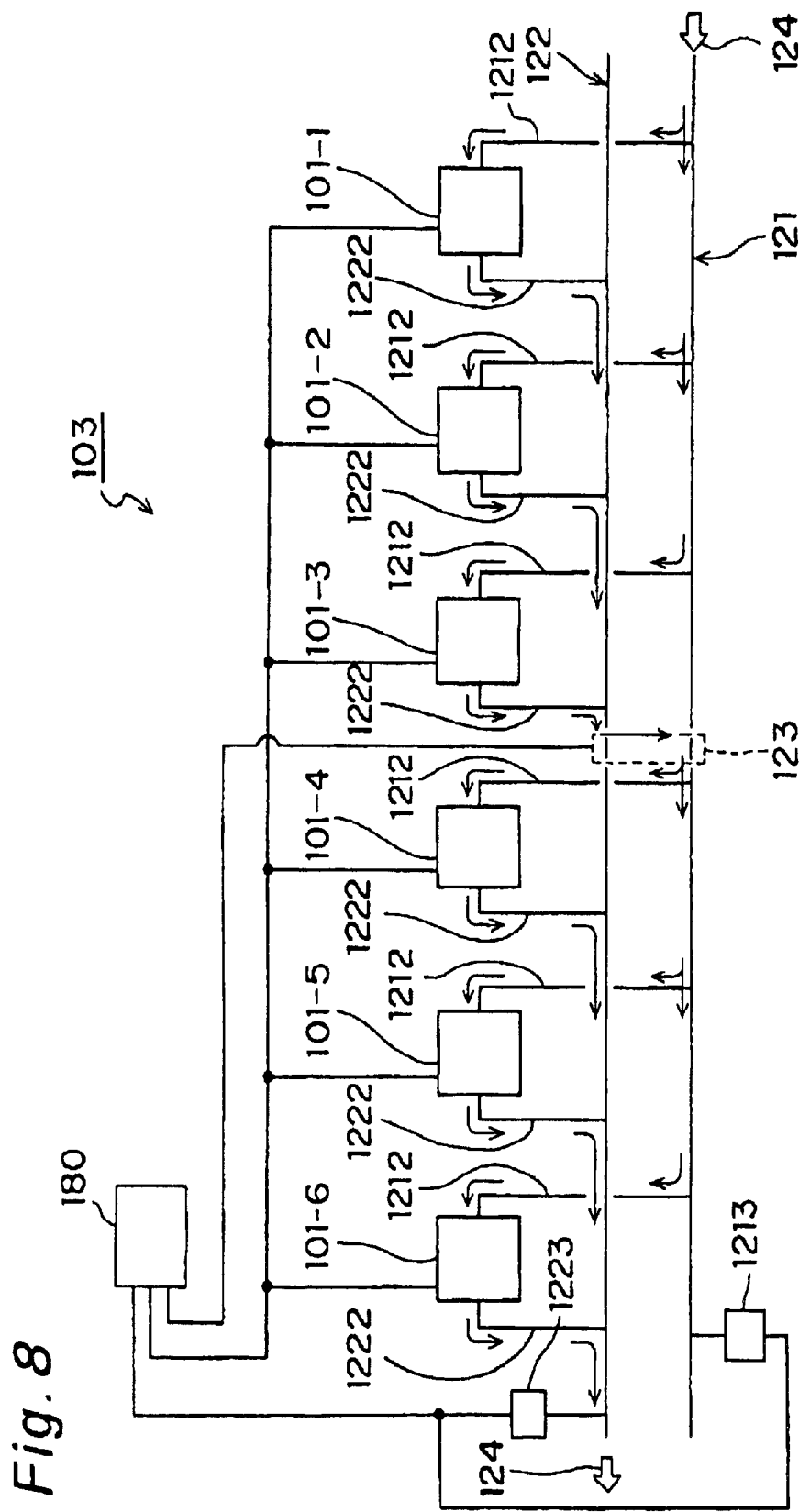
FIG. 8 is a diagram of a component mounting apparatus comprising six component mounting apparatuses of FIG. 1 arranged in series.

Moreover, although an unprocessed board transfer path 1211 and a process-finished board transfer path 1221 to be described below are illustrated in FIGS. 1, 7 and 8 as if arranged in parallel in the same plane to facilitate a graphic expression and understanding of the invention, actually, the unprocessed board transfer path 1211 and the process-finished board transfer path 1221 are disposed overlapping one another in a vertical direction as shown in FIG. 3 from a viewpoint of saving space in the board transferring apparatus 120 of the present first embodiment. Needless to say, the arrangement of the unprocessed board transfer path 1211 and the process-finished board transfer path 1221 is not limited to the above-described positional relationship and can be made parallel in the same plane as shown in FIG. 1 and the like. In addition, although the process-finished board transfer path 1221 is set to an upside and the unprocessed board transfer path 1211 is placed below the process-finished board transfer path in the present first embodiment as will be discussed later, this arrangement may be inverted.

Figure 4:
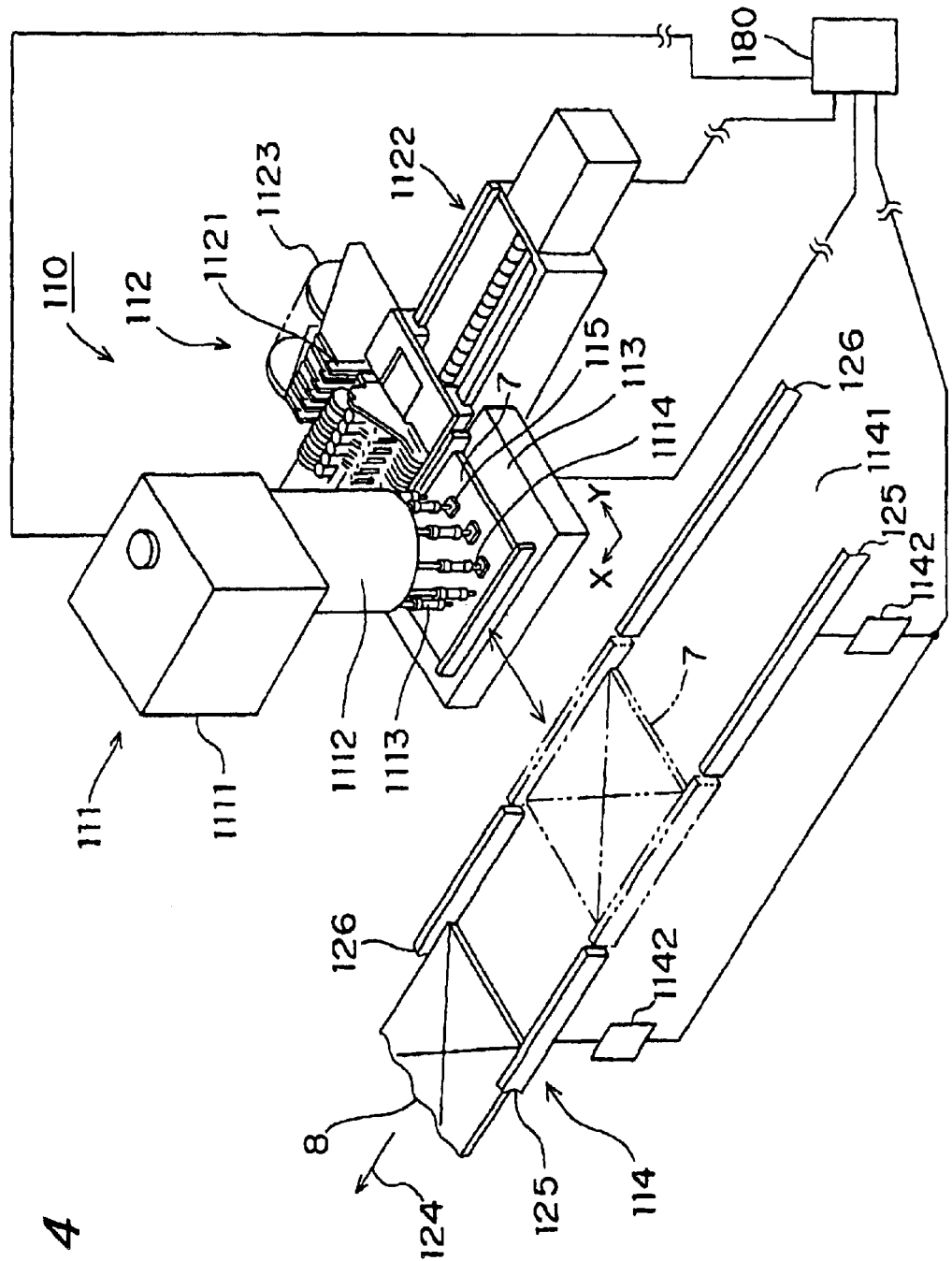
FIG. 4 is an oblique view showing structure of a component supply/mounting machine included in the component mounting apparatus shown in FIG. 1.

The component supply/mounting machine 110 is a high-speed type machine of a so-called rotary form and comprises, as shown in FIG. 4, a component hold/mounting unit 111, a component supply unit 112 for supplying electronic components to the component hold/mounting unit 111, an XY-table 113 movable in XY-directions orthogonal to each other for loading an unmounted board 7 thereon, and a board supply/send unit 114 for supplying the unmounted board 7 to the XY-table 113 and sending the unmounted board 7 from the XY-table 113.

The component hold/mounting unit 111 has a rotating device 1111 and a rotary part 1112 intermittently rotatable by the rotating device 1111 by a predetermined angle. To a periphery of the rotary part 1112 are set, so as to move up and down, component hold/lift parts 1113 spaced from one another at equal intervals and each having a component hold member 1114 fitted to a leading end for holding an electronic component, for example, by suction. The thus-constituted component hold/mounting unit 111 will not move in the XY-directions.

The component supply unit 112 is comprised of component supply parts 1121 with reels 1123 installed for each kind of electronic component 115, which unwinds tapes, storing electronic components 115, from the reels 1123, thereby supplying respective electronic components 115, and a moving device 1122 having component supply parts 1121 set thereto for moving the component supply parts 1121 in the X direction to make the component hold/mounting unit 111 hold desired electronic components 115.

The board supply/send unit 114 has a board transfer passage 1141, and a driving device for transfer 1142 for transferring an unmounted board 7 and mounted board 8 along the board passage 1141. The board transfer passage 1141 is formed of a fixed side rail 125 and a movable side rail 126 extending in parallel along a transfer direction 124 of the unmounted board 7 and mounted board 8. The board transfer passage can be fitted to boards 7, 8 of any size by moving the movable side rail 126 in a breadth direction of the boards 7, 8. The fixed side rail 125 and the movable side rail 126 are provided with belt conveyors capable of supporting opposite side edge portions of respective boards 7, 8. The boards 7, 8 are transferred in the transfer direction 124 by driving each belt conveyor via the driving device 1142 for transfer.

The above-described component hold/mounting unit 111, the component supply unit 112, the XY-table 113, and the board supply/send unit 114 are each connected to the controller 180 and controlled in operation by the controller 180.

The electronic components 115 are supplied and mounted by operations, to be described below, in the component supply/mounting machine 110 constituted as above. Specifically, unmounted board 7 is first placed on the XY-table 113 by the board supply/send unit 114. The unmounted board 7 is moved by the XY-table 113 to below the rotary part 1112 and is further positioned to make a mounting preparation position at the rotary part 1112 agree with a mounting position on the unmounted board 7. In the meantime, the component supply part 1121, which is to supply a desired electronic component 115, is positioned by the moving device 1122 to a component hold position where the component hold member 1114 is to hold the electronic component 115 received from the component supply part 1121. The component hold/lift part 1113 moves down and the component hold member 1114 holds the electronic component 115. After this holding, the component hold/lift part 1113 moves up and the rotary part 1112 is rotated by the rotating device 1111 to arrange the component hold/lift part 1113 to the mounting preparation position for mounting the held electronic component 115 to the board 7. Then, the component hold/lift part 1113 is moved down, thereby mounting the electronic component 115 to the mounting position of the board 7. The component hold/lift part 1113 moves up after this mounting and is disposed again to the component hold position by rotation of the rotary part 1112.

Electronic components 115 are sequentially mounted by each of the component hold members 1114 onto the unmounted board 7 through a repetition of the above operations.

While the component supply/mounting machine 110 in the present first embodiment is a high-speed type machine of the so-called rotary form, the machine is not limited to this and various known component supply/mounting machines, for example, a so-called multi-function type, in which a mounting head part with component hold members 1114 can freely move in XY-directions and can supply components also from trays, and the like, can be adopted.

The board transferring apparatus 120 will be described next.

The board transferring apparatus 120 is comprised of an unprocessed board transfer unit 121, a process-finished board send-out unit 122, and a shift device 123.

The unprocessed board transfer unit 121 is equipped with the unprocessed board transfer path 1211 for transferring unmounted boards 7 to be processed by the component supply/mounting machine 110, and also with an unprocessed board carry-in device 1212 which moves between the unprocessed board transfer path 1211 and the component supply/mounting machine 110 for carrying the unmounted boards 7 into the component supply/mounting machine 110. The unprocessed board transfer path 1211 is formed of a fixed side rail 125 and a movable side rail 126 extending in parallel along the transfer direction 124 of the unmounted boards 7 and mounted boards 8, functioning as a bypass line of the above board transfer passage 1141. The unprocessed board transfer path 1121 can be conformed to unmounted boards 7 of various sizes by moving the movable side rail 126 in a breadth direction of the unmounted boards 7. A belt conveyor is set to each of the fixed side rail 125 and the movable side rail 126, which is capable of supporting opposite side edge portions of the unmounted board 7. Each unmounted board 7 is transferred in the above transfer direction 124 by driving each belt conveyor by a driving device 1213 for transferring unmounted boards.

The unprocessed board carry-in device 1212 has, as shown in FIG. 3, a skew board hold part 12121 and a drive part 12122. As is described before and as is clear from FIG. 3, in the first embodiment, since the unprocessed board transfer path 1211 and the process-finished board transfer path 1221 are arranged overlapping one another in the vertical direction, and moreover, the process-finished board transfer path 1221 and the board transfer passage 1141 are arranged to be the same height, the drive part 12122 reciprocates the skew board hold part 12121 slantwise between the unprocessed board transfer path 1211 and the board transfer passage 1141. A sensor 12123, e.g., a limit sensor, a proximity sensor or the like, for detecting that the skew board hold part 12121 is positioned at the unprocessed board transfer path 1211, is provided in the first embodiment. An arrangement position of the skew board hold part 12121 is determined by the controller 180 based on a signal supplied from the sensor 12123 to the controller 180.

The drive part 12122 is constructed from a structure including a ball screw in the present first embodiment, having a motor 121221 corresponding to a driving source being controlled in operation by the controller 180. The skew board hold part 12121 including the above fixed side rail 125 and the movable side rail 126 forms part of the unprocessed board transfer path 1211, when positioned at the unprocessed board transfer path 1211, and forms part of the board transfer passage 1141 when positioned at the board transfer passage 1141.

The unprocessed board carry-in device 1212 of the above constitution operates in a manner as will be described hereinbelow. The skew board hold part 12121 is normally arranged at the unprocessed board transfer path 1211. When it is necessary to carry a transferred unmounted board 7 to the component supply/mounting machine 110, the unmounted board 7 is held between the fixed side rail 125 and the movable side rail 126 of the skew board hold part 12121 and shifted to the board transfer passage 1141 by the drive part 12122. A mounting operation is performed for the unmounted board 7 carried to the board transfer passage 1141. Meanwhile, the skew board hold part 12121 returns to the unprocessed board transfer path 1211 after the unmounted board 7 is carried to the board transfer passage 1141. When it is not necessary to carry the unmounted board 7 to the component supply/mounting machine 110, the unmounted board 7 passes the skew board hold part 12121.

The process-finished board send-out unit 122 has the process-finished board transfer path 1221 for transferring mounted boards 8 processed by the component supply/mounting machine 110 and, a process-finished board send-out device 1222 which moves between the process-finished board transfer path 1221 and the component supply/mounting machine 110 to send a mounted board 8 from the component supply/mounting machine 110 to the process-finished board transfer path 1221. Similar to the above unprocessed board transfer path 1211, the process-finished board transfer path 1221 is constituted of a fixed side rail 125 and a movable side rail 126 extending in parallel along the transfer direction 124, thereby functioning as a bypass line of the board transfer passage 1141. The process-finished board transfer path can be suited to mounted boards 8 of various sizes by moving the movable side rail 126 in a breadth direction of the boards 8. The fixed side rail 125 and the movable side rail 126 are equipped with belt conveyors that can support opposite side edge portions of mounted board 8, and therefore the board 8 is transferred in the transfer direction 124 by driving each of the belt conveyors via a driving device 1223 for transferring completely mounted boards.

Figure 5:
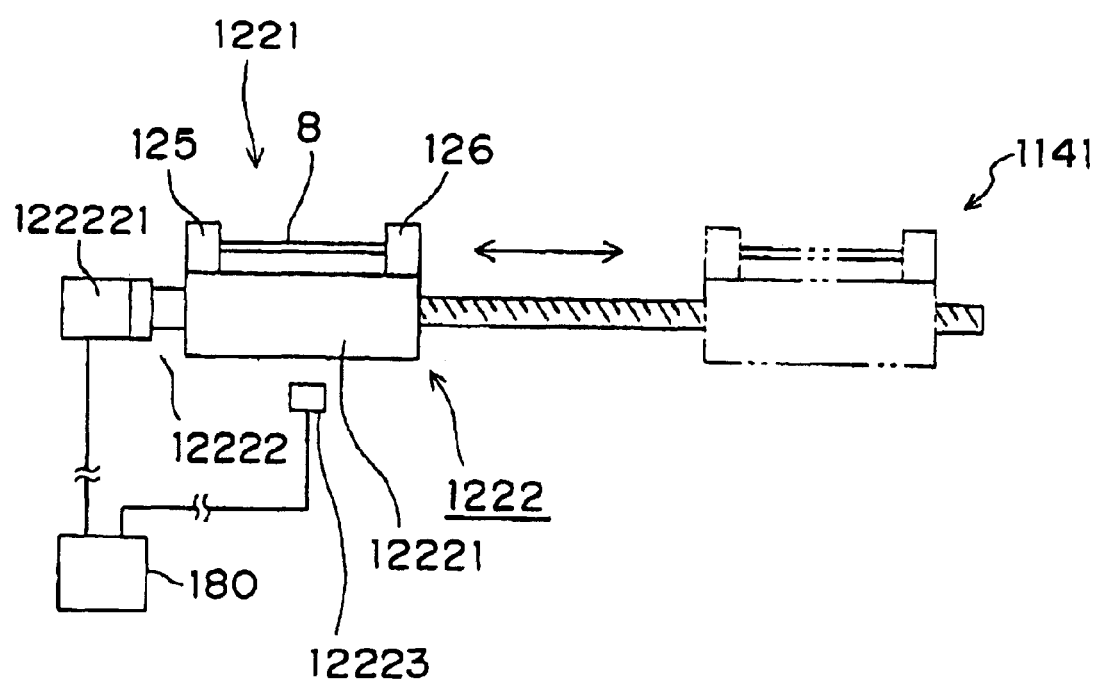
FIG. 5 is a diagram showing structure of a process-finished board send-out device included in the component mounting apparatus shown in FIG. 1.

The process-finished board send-out device 1222 has, as indicated in FIG. 5, a board hold part 12221 and a drive part 12222. The drive part 12222 reciprocates the board hold part 12221 between the process-finished board transfer path 1221 and the board transfer passage 1141. In the present first embodiment, a sensor 12223, for instance, a limit switch, a proximity sensor or the like is set for detecting that the board hold part 12221 is positioned at the process-finished board transfer path 1221, so that an arrangement position of the board hold part 12221 is determined by the controller 180 on a basis of a signal supplied from the sensor 12223 to the controller 180.

The drive part 12222 is formed from a structure including a ball screw in the first embodiment. A motor 122221 corresponding to a driving source is controlled in operation by the controller 180. The board hold part 12221 with the fixed side rail 125 and the movable side rail 126 forms part of the process-finished board transfer path 1221 when positioned at the process-finished board transfer path 1221, and forms part of the board transfer passage 1141 when positioned at the board transfer passage 1141.

The process-finished board send-out device 1222 thus constituted operates as follows. The board hold part 12221 is normally arranged at the process-finished board transfer path 1221, and is moved by the drive part 12222 from the process-finished board transfer path 1221 to the board transfer passage 1141 when a mounted board 8 is to be carried out from the component supply/mounting machine 110. After disposed to the board transfer passage 1141, the board hold part 12221 holds the mounted board 8 between the fixed side rail 125 and the movable side rail 126 of the board hold part 12221, and is subsequently moved from the board transfer passage 1141 to the process-finished board transfer path 1221. The mounted board 8 sent to the process-finished board transfer path 1221 is transferred along the process-finished transfer path 1221 in the transfer direction 124 by the driving device 1223 for transferring process-finished boards.

The shift device 123, which is one of characteristic features constituting the board transferring apparatus 120 of the first embodiment, will be described now.

Figure 6:
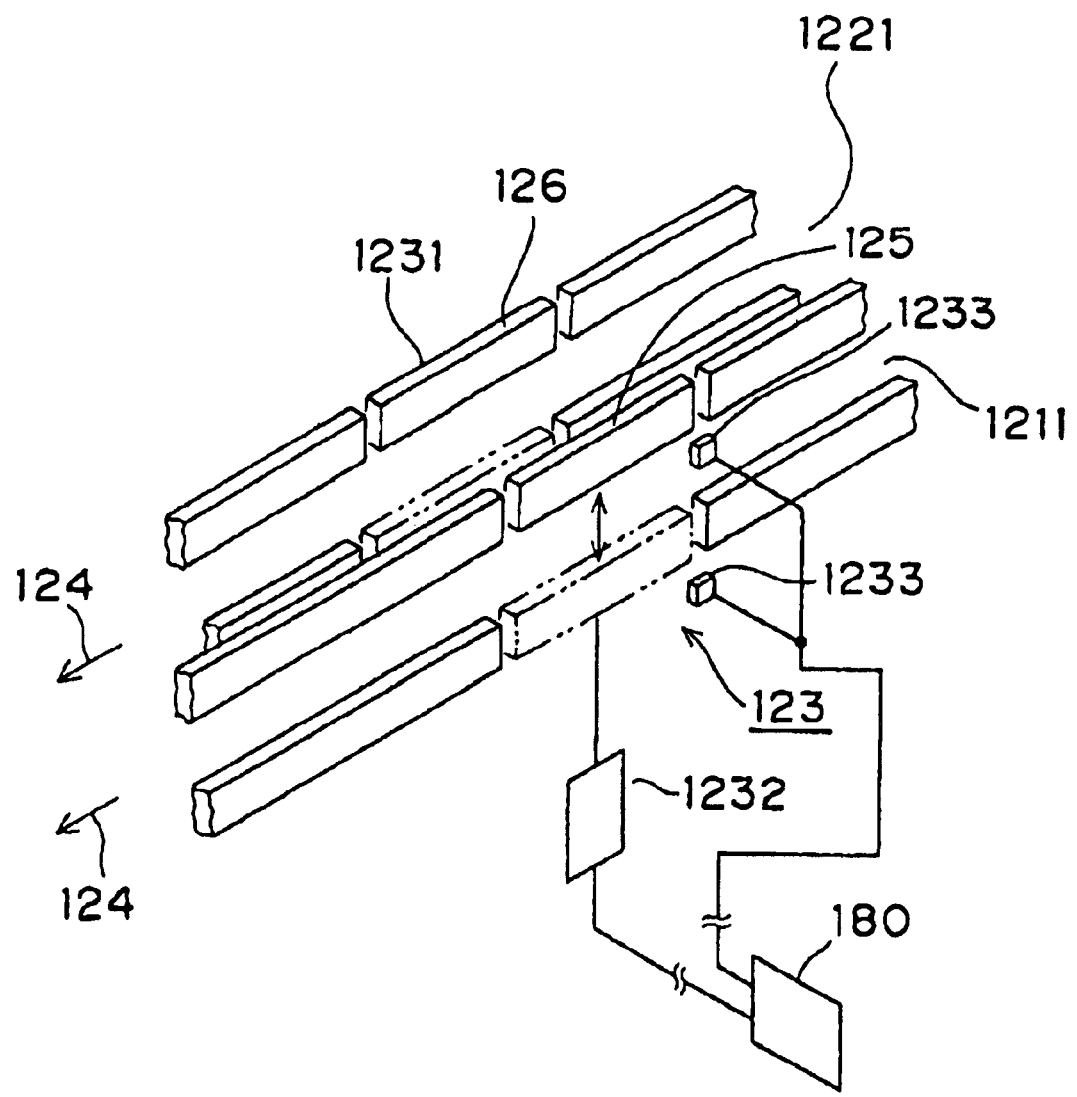
FIG. 6 is an oblique view showing structure of a shift device included in the component mounting apparatus shown in FIG. 1.

The shift device 123 has, as indicated in FIG. 6, a path change part 1231 and a drive part 1232. The drive part 1232 reciprocates the path change part 1231 up and down between the process-finished board transfer path 1221 and the unprocessed board transfer path 1211. According to the present first embodiment, a sensor 1233, e.g., a limit switch, a proximity sensor or the like is installed at each of the process-finished board transfer path 1221 and the unprocessed board transfer path 1211, whereby an arrangement position of the path change part 1231 is determined by the controller 180 based on a signal supplied from a corresponding sensor 1233 to the controller 180.

The drive part 1232 is of a structure having an air cylinder in this first embodiment. The air cylinder, corresponding to a driving source, is controlled in operation by the controller 180. The path change part 1231 having the above fixed side rail 125 and movable side rail 126 forms part of the process-finished board transfer path 1221 when positioned at the process-finished board transfer path 1221, and forms part of the unprocessed board transfer path 1211 when positioned at the unprocessed board transfer path 1211.

Since the process-finished board transfer path 1221 and the unprocessed board transfer path 1211 are arranged at an upper side and lower side respectively, the path change part 1231 is moved in an up-down direction by the drive part 1232. Needless to say, however, a move direction of the path change part 1231 is not limited to this. That is, it is enough for the path change part 1231 to move between the process-finished board transfer path 1221 and the unprocessed board transfer path 1211.

Although the shift device 123 normally transports a mounted board 8 from the process-finished board transfer path 1221 to the unprocessed board transfer path 1211, the shift device can transfer an unmounted board 7 from the unprocessed board transfer path 1211 to the process-finished board transfer path 1221.

Also, while the shift device 123 shifts one board 8, 7 during one shift operation, the shift device is not restricted to this form of operation and can be adapted to shift a plurality of boards 8, 7 during one shift operation, for example, by constituting the path change part 1231 so that the plurality of boards 8, 7 can be aligned in a longitudinal direction along the transfer direction 124. The path change part 1231 for moving the plurality of boards 8, 7 is not limited to the above structure and can be configured to hold, e.g., the boards 8, 7 in layers in a thickness direction of the boards.

Although the shift device 123 of the above constitution will be detailed as to its operation of mounting components, the shift device 123 itself operates roughly in a manner as will be described below. For example, when it is necessary to move a mounted board 8 to the unprocessed board transfer path 1211 while the path change part 1231 is positioned at the process-finished board transfer path 1221, the path change part 1231 is moved by the drive part 1232 from the process-finished board transfer path 1221 to the unprocessed board transfer path 1211 after holding the mounted board 8 between the fixed side rail 125 and the movable side rail 126 of the path change part 1231. The mounted board 8 sent into the unprocessed board transfer path 1211 is transferred by the driving device 1213 along the unprocessed board transfer path 1211 in the transfer direction 124.

One component mounting apparatus 101 is provided in the above-discussed constitution. A further modification can be formed as will be described below.

Specifically, a plurality of component mounting apparatuses 101-1, 101-2, . . . may be arranged in the transfer direction 124 as in a component mounting apparatus 102 shown in FIG. 7. In this case, shift devices 123 can be installed at respective component mounting apparatuses 101-1, 101-2, . . . or one shift device 123 can be installed for every plurality of component mounting apparatuses 101. In other words, at least one shift device 123 is satisfactory.

In a case where a plurality of component-mounted board production apparatuses for carrying out different processes relative to each other are arranged in the transfer direction 124, shift device 123 may be interposed between a first component-mounted board production apparatus and a second component-mounted board production apparatus, which perform different processes relative to each other. For example, when a plurality of, e.g., six component mounting apparatuses 101-1 to 101-6 are arranged in the transfer direction 124 as in a component mounting apparatus 103 of FIG. 8, and types of components to be mounted by the component mounting apparatuses 101-1 to 101-3 and by the component mounting apparatuses 101-4 to 101-6 are different; in other words, when part of all components are to be mounted by the component mounting apparatuses 101-1 to 101-3, and remaining components are to be mounted by the component mounting apparatuses 1014 to 101-6, to one unmounted board 7, the shift device 123 can be arranged between the component mounting apparatus 101-3 and the component mounting apparatus 101-4.

A component mounting operation performed by the above-discussed component mounting apparatus will be described hereinbelow with use of the component mounting apparatus 102 in the constitution having two component mounting apparatuses 101-1, 101-2 arranged in series along the transfer direction 124 as shown in FIG. 7 as an example. A component mounting operation for unmounted boards 7 at the component supply/mounting machine (110-1, 110-2) in each component mounting apparatus (101-1, 101-2) is identical to the conventional one and will therefore be briefly described.

All performances of the component mounting operation are controlled by the controller 180. More specifically, the controller 180 has a program stored therein in relation to the component mounting operation such as a relationship between mounting positions on unmounted boards 7 and electronic components 115 to be mounted to the mounting positions, a mounting order, and the like. The controller 180 controls operation of the component supply/mounting machines (110-1, 110-2) and moreover controls operation of the unprocessed board transfer unit 121 including the unprocessed board carry-in device 1212, the process-finished board send-out unit 122 including the process-finished board send-out device 1222, and the shift device 123.

In the description below, unmounted boards 7 transferred from an upstream side of the component mounting apparatus 102 are all identical boards.

An unmounted board 7 transferred on the unprocessed board transfer path 1211 by the driving device 1213, for transferring unprocessed boards from the upstream side of the component mounting apparatus 102, is sent into the skew board hold part 12121 of the unprocessed board carry-in device (1212-1, 1212-2). Regarding a carry-in operation, the controller 180 confirms an arrangement position of the skew board hold part 12121 on a basis of a signal of the sensor 12123, and permits the unmounted board 7 to enter the skew board hold part 12121 as described above when the skew board hold part is positioned at the unprocessed board transfer path 1211. On the other hand, unless the skew board hold part 12121 is positioned at the unprocessed board transfer path 1211, the controller 180 controls operation of the driving device 1213 for transferring unprocessed boards, thereby temporarily stopping the unmounted board 7 at a stop region 1214 located immediately before the unprocessed board carry-in device (1212-1, 1212-2). The controller permits the unmounted board 7 to enter after the skew board hold part 12121 is disposed at the unprocessed board transfer path 1211.

When the unmounted board 7 advances to the skew board hold part 12121, moreover, the controller 180 determines whether or not the unmounted board 7 can be sent into the component supply/mounting machine 110-1 of the component mounting apparatus 101-1 based on factors such as presence of the unmounted board 7 on the XY-table 113, the fact that the component supply/mounting machine 110-1 remains at rest, and the like.

When sending is decided to be possible, the skew board hold part 1212i holding the unmounted board 7 moves to the board transfer passage 1141 from the unprocessed board transfer path 1211. The unmounted board 7 of the skew board hold part 12121, after reaching the board transfer passage 1141 is transferred along the board transfer passage 1141, loaded on the XY-table 113 disposed at the board transfer passage 1141, positioned to a predetermined position and fixed.

Meanwhile, if sending of the unmounted board 7 into the component supply/mounting machine 110-1 of the component mounting apparatus 101-1 is determined to be impossible, the controller 180 controls the driving device 1213 for transferring unprocessed boards, thereby passing and transferring the unmounted board 7 along the unprocessed board transfer path 1211 through the skew board hold part 12121, located at the unprocessed board transfer path 1211, and through the path change part 1231, which is positioned at the unprocessed board transfer path 1211 of the shift device 123-1 of the component mounting apparatus 101-1. The unmounted board 7 is transferred to the stop region 1214 of the component mounting apparatus 101-2 of a next stage. However, when supplying of the unmounted board 7 to the component mounting apparatus 101-2 is forbidden, that is, when the component mounting apparatus 101-1 and the component mounting apparatus 101-2 are programmed to mount different electronic components, the unmounted board 7 is kept waiting at the skew board hold part 12121 until sending of the unmounted board 7 to the component supply/mounting machine 110-1 is allowed.

If sending of the unmounted board 7 to the component mounting apparatus 101-1 is impossible, whether the unmounted board 7 is to be transferred to the component mounting apparatus 101-2 of the next stage or is to be kept waiting, operation of the unprocessed board carry-in device 1212 is conformed to the mounting program stored in the controller 180 on the basis of the constitution of the component mounting apparatus, a number of electronic components to be mounted and an arrangement position of the shift device 123 as will be described in detail later.

A component mounting operation for the unmounted board 7 is performed when the unmounted board 7 can be carried to the component supply/mounting machine 110-1 and can be disposed to below rotary part 1112 of component hold/mounting unit 111 by XY-table 113 as described above. Concretely, the unmounted board 7 on the XY-table 113 is positioned as described earlier so that a mounting position on the unmounted board 7 agrees with a mounting preparation position of the rotary part 1112, and furthermore, component supply part 1121 is positioned by the moving device 1122 to the component hold position where the component hold member 1114 is to hold an electronic component 115 supplied from the component supply part 1121. After the component hold member 1114 holds the electronic component 115 at the component hold position, the rotary part 1112 rotates to the mounting preparation position, then the electronic component 115 is mounted to the mounting position of the unmounted board 7. After this mounting, the component hold member 1114 moves up and is positioned again to the component hold position by rotation of the rotary part 1112. Electronic components 115 are sequentially mounted to mounting positions on the unmounted board 7 by component hold members 1114 of the rotary part 1112, respectively, in this manner.

After all of predetermined electronic components 115 are mounted, mounted board 8 is removed from the XY-table 113 to the board supply/send unit 114, and is further moved to and held by the board hold part 12221 of the process-finished board send-out device 1222 located at the board transfer passage 1141.

The board hold part 12221 holding the mounted board 8 is moved by the drive part 12222 from the board transfer passage 1141 to the process-finished board transfer path 1221. The mounted board 8 moved to the process-finished board transfer path 1221 is transferred along the process-finished board transfer path 1221 in the transfer direction 124 by the driving device 1223 and sent to the path change part 1231 of the shift device 123.

When there are boards 7 or 8 transferred along the process-finished board transfer path 1221 from an upstream side of the component mounting apparatus 101-1, the board hold part 12221 located at the process-finished board transfer path 1221 lets these boards 7, 8 alike pass towards a downstream side of the component mounting apparatus 101-1.

In a case where the program in the controller 180 is constructed so as to change the path change part 1231, which is positioned at the process-finished board transfer path 1221 and to which a mounted board 8 is carried from the process-finished board transfer path 1221 to the unprocessed board transfer path 1211, the controller 180 makes the path change part 1231 hold the mounted board 8 and then drives the drive part 1232 of the shift device 123 to move the path change part 1231 from the process-finished board transfer path 1221 to the unprocessed board transfer path 1211. The mounted board 8 shifted to the unprocessed board transfer path 1211 is sent by the driving device 1213 to the stop region 1214 in the component mounting apparatus 101-2. Regarding the mounted board 8 carried into the stop region 1214 of the component mounting apparatus 101-2, control and operation similar to the control and operation which is performed when the unmounted board 7 is sent to the component mounting apparatus 101-1 described above, are performed.

On the other hand, when it is not necessary to move the path change part 1231 from the process-finished board transfer path 1221 to the unprocessed board transfer path 1211, the path change part 1231 is left as it is positioned at the process-finished board transfer path 1221 to transfer a transferred mounted board 8 to the component mounting apparatus 101-2.

As described hereinabove, in the component mounting apparatuses 101, 102 of the present first embodiment, a path for sending out mounted boards 8 can be switched to the process-finished board transfer path 1221 or to the unprocessed board transfer path 1211. Whether or not to move a mounted board 8 by the shift device 123 from the process-finished board transfer path 1221 to the unprocessed board transfer path 1211 is, as will be detailed below, pursuant to the mounting program stored in the controller 180 on the basis of the constitution of the component mounting apparatus, the number of electronic components to be mounted and the arrangement position of the shift device 123.

Controlling operation of the unprocessed board carry-in device 1212 and the shift device 123 according to the aforementioned mounting program will be described in detail.

Following operation is performed in a case of completely mounting all of electronic components to be mounted to a printed board, to be produced, by one component mounting apparatus 101. Specifically, a first unmounted board 7 transferred along the unprocessed board transfer path 1211 is supplied to the component supply/mounting machine 110-1 by the unprocessed board carry-in device 1212-1, where a mounting operation is performed. A second unmounted board 7 transferred along the unprocessed board transfer path 1211 during the mounting operation passes the skew board hold part 12121 of the unprocessed board carry-in device 1212-1 because the component mounting apparatus 101-1 is in the middle of the mounting operation, and then is transferred to the unprocessed board carry-in device 1212-2 of the component mounting apparatus 101-2 of the next stage. The second unmounted board is supplied to the component supply/mounting machine 110-2 by the unprocessed board carry-in device 1212-2 to be subjected to a mounting operation.

After all components are mounted to the first unmounted board 7 by the component supply/mounting machine 110-1, mounted board 8 is sent out by the process-finished board send-out device 1222-1 to the process-finished board transfer path 1221, and transferred along the process-finished board transfer path 1221 to a next process. A representative example of the next process is a soldering operation or the like. Since the component supply/mounting machine 110-1 becomes able to accept an unmounted board 7 after the mounted board 8 is sent out, a third unmounted board 7 is supplied by the unprocessed board carry-in device 1212-1 to the component supply/mounting machine 110-1.

Similarly, after all components are mounted to the second unmounted board 7 by the component supply/mounting machine 110-2, this mounted board 8 is sent out by the process-finished board send-out device 1222-2 to the process-finished board transfer path 1221, and transferred along the process-finished board transfer path 1221 to the above-mentioned next process. The component supply/mounting machine 110-2 can consequently accept supply of a fourth unmounted board 7.

In a case where all electronic components to be mounted to a printed board to be produced are mounted by a single component mounting apparatus 101 as described above, this mounted board 8 is not shifted by the shift device 123, but is sent out from the process-finished board transfer path 1221 in the same manner as in the related art. Therefore, with a plurality of component mounting apparatuses 101-1, 101-2 arranged as shown in FIG. 7, production efficiency can be improved by sending out mounted boards 8 from respective component mounting apparatuses 101-1, 101-2.

On the other hand, if all electronic components to be mounted to a printed board to be produced are not completely mounted by one component mounting apparatus, for example, when part of the electronic components are mounted by the component mounting apparatus 101-1 and the remaining electronic components are mounted by the component mounting apparatus 101-2, thereby producing one printed board, following operation is performed. A first unmounted board 7 transferred along the unprocessed board transfer path 1211 is supplied by the unprocessed board carry-in device 1212-1 to the component supply/mounting machine 110-1, and a mounting operation is conducted. After components are mounted to the first unmounted board 7, a mounted board 8 is carried out by the process-finished board send-out device 1222-1 to the process-finished board transfer path 1221, then moved by the shift device 123 from the process-finished board transfer path 1221 to the unprocessed board transfer path 1211 and supplied by the unprocessed board carry-in device 1212-2 of the component mounting apparatus 101-2 to the component supply/mounting machine 110-2. After the remaining components are mounted to the mounted board 8 by the component supply/mounting machine 110-2, the mounted board 8 is sent out by the process-finished board send-out device 1222-2 from the component supply/mounting machine 110-2 to the process-finished board transfer path 1221, and transferred along the process-finished board transfer path 1221 to a next process.

Since use of the shift device 123 enables boards to be transported between the unprocessed board transfer path 1211 and the process-finished board transfer path 1221, need of setting a new mounting line for mounting remaining components is eliminated. Further, even when a printed board to be produced is to be changed, the board transfer units 121, 122 of the component mounting apparatus of the first embodiment can be used by changing types of components to be mounted by each component supply/mounting machine 110 and by controlling a board movement operation via the shift device 123.

Accordingly, production efficiency can be improved in accordance with kinds of boards to be produced without greatly changing a layout in a factory, including a layout of a board production line, incidental facilities, and the like.

FIG. 8 shows a constitution in which, for a case where all electronic components to be mounted to a printed board to be produced are not mounted by one component mounting apparatus, six component mounting apparatuses 101-1 to 101-6 are aligned in series along transfer direction 124 so that three component mounting apparatuses 101-1 to 101-3 of an upstream side mount equal components while component mounting apparatuses 101-4 to 101-6 of a downstream side mount equal components, and one shift device 123 is arranged only between component mounting apparatus 101-3 and component mounting apparatus 101-4. The component mounting apparatuses 101-1 to 101-3 and the component mounting apparatuses 101-4 to 101-6 mount different components relative to each other. Each of the component mounting apparatuses 101-1 to 101-3 mounts part of all components, and each of the component mounting apparatuses 101-4 to 101-6 mounts a remainder of the components.

In the above constitution, a first unmounted board 7 to a third unmounted board 7 transferred along unprocessed board transfer path 1211 are sequentially supplied to component supply/mounting machines 110-1 to 110-3, respectively. Each of mounted boards 8 having components mounted by the component supply/mounting machines 110-1 to 110-3 respectively is sequentially carried out to process-finished board transfer path 1221. In this example, three mounted boards 8 are moved by the shift device 123 at a time from the process-finished board transfer path 1221 to the unprocessed board transfer path 1211. The three mounted boards 8 carried to the unprocessed board transfer path 1211 are sequentially supplied to component supply/mounting machines 1104 to 110-6 of the component mounting apparatuses 101-4 to 101-6, respectively, and a mounting operation is performed by each of the component mounting apparatuses 101-4 to 101-6. Upon completion of these mounting operations, finished printed boards are sequentially sent out from the component supply/mounting machines 110-4 to 110-6 to the process-finished board transfer path 1221 and transferred along the process-finished board transfer path 1221 to a next process.

The above-referred case, that all electronic components to be mounted to a printed board to be produced are not completely mounted by one component mounting apparatus, corresponds not only to a case where it is impossible to have component supply part 1121 supply necessary components for producing one printed board in one component mounting apparatus 101, but also to a case where different electronic components are only partly used and common electronic components are used for a remaining part of boards for, e.g., models of portable phones, personal computers or the like. In such case as above when only part of the electronic components are different, the common electronic components are mounted, for example, by a plurality of component mounting apparatuses 101 arranged, e.g., at the upstream side, then common electronic component-mounted boards 8 are moved by the shift device 123 from the process-finished board transfer path 1221 to the unprocessed board transfer path 1211, so that different electronic components are mounted by, e.g., a plurality of component mounting apparatuses 101 arranged, e.g., at the downstream side, respectively. Boards in conformity with each model can thus be produced and a need of setting production lines each corresponding to printed boards of each model is eliminated.

According to the board transferring apparatus and the component mounting apparatus with the board transferring apparatus of the first embodiment as above, when a plurality of component mounting apparatuses 101 are arranged, it can meet various forms of production from when each of the component mounting apparatuses 101 mounts all components to each unmounted board 7 to when each of the component mounting apparatuses 101 mutually mounts different components. In other words, by storing into the controller 180 a processing program based on types and an amount of components to be mounted by the component mounting apparatuses 101 arranged along the transfer direction 124, a setting position of the shift device 123 and a production form performed for the boards, the controller 180 can control operation of the unprocessed board transfer unit 121, the process-finished board transfer unit 122 and the shift device 123, so that it can meet the above various forms of production.

As discussed hereinabove, according to the board transferring apparatus, the board transfer method performed by the board transferring apparatus, and the component mounting apparatus having the board transferring apparatus of the first embodiment, since the shift device 123 is included, various forms of production can be met as described above in a space equal to a space occupied by a component mounting apparatus including the unprocessed board transfer path 1211 and the process-finished board transfer path 1221 and disclosed in the published application of JP,10-256785,A. A layout in a factory, including a layout of a board production line and incidental equipment, and the like is not necessary to be changed substantially.

Provision of the shift device 123 can improve production efficiency in accordance with kinds of boards to be produced, as described above.

The foregoing description is based on unmounted boards 7 transferred from a previous process of the component mounting apparatus 101, 102 being identical to one another. As in FIGS. 7 and 8, when a plurality of component mounting apparatuses 101 are arranged along the transfer direction 124 to mount components, it is hard to determine by which of the component supply/mounting machines 110 each of mounted boards 8, sent out from a mounting process, is to have components mounted thereto. Therefore, for example, when mounting failures frequently occur, it is difficult to specify the component supply/mounting machine 110 causing a mounting failure.

As such, each component mounting apparatus may have a mark application device, which has a different mark in correspondence to each component mounting apparatus, for applying a mark to mounted boards 8. In this arrangement, the mark application device can apply a mark, specific to a component mounting apparatus, to a mounted board 8 before the board is carried into a component mounting apparatus of a next stage after being sent out by the process-finished board send-out device 1222 to the process-finished board transfer path 1221. A component mounting apparatus causing a mounting failure can be specified accordingly, for instance, by confirming the mark applied to the mounted board 8 with the mounting failure.

As described above, although the first embodiment is based on unmounted boards 7 transferred from a previous process of the component mounting apparatus 101, 102 being identical to one another, the embodiment is not limited to this. For example, boards of different kinds, because of a difference of, e.g., a board size, components mounted beforehand, and the like can be transferred from a previous process. The controller 180 controls operation of the unprocessed board carry-in device 1212 and the shift device 123 in this constitution alike, so that boards can be supplied to component mounting apparatuses corresponding to kinds of boards to complete target mounted boards 8.

While an operational control of the shift device 123 is performed in accordance with a mounting program stored in the controller 180 in the above first embodiment, control is not limited to this. For example, a detector may be installed before the shift device 123 in the transfer direction 124. The detector detects an information part which is formed by, e.g., a bar code or the like, attached to a transferred board 8, 7, and has information of operational control for the shift device 123, thereby controlling operation of the shift device 123.

The component mounting apparatus is depicted as an example of the component-mounted board production apparatus in the above-described first embodiment. In a case, for instance, of a printing apparatus for printing solder paste to boards, the following arrangement and operation can be devised, for example. Concretely, printing apparatuses with respective masks of different sizes are provided, and boards of different sizes corresponding to the respective masks are sequentially transferred. The shift device 123 is controlled in operation so that each board is supplied to a printing apparatus having a proper mask.

Second Embodiment

Figure 10:
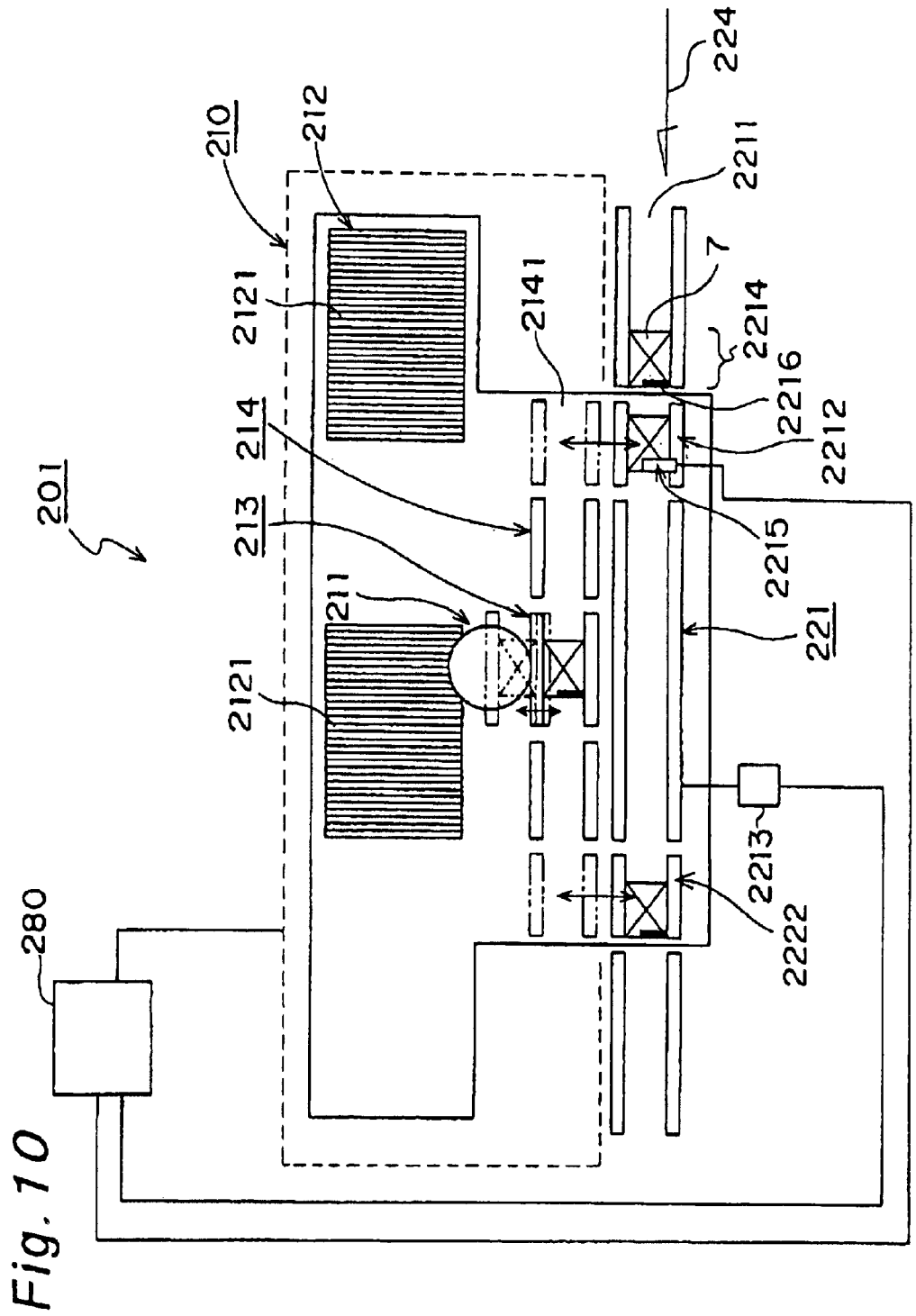
FIG. 10 is a diagram showing a constitution of a component mounting apparatus according to a second embodiment of the present invention.

FIG. 10 shows a component mounting apparatus 201 provided with a board transferring apparatus 221 in a second embodiment, and includes a component supply/mounting machine 210 for receiving an unmounted board 7 from the board transferring apparatus 221, mounting electronic components onto this board and sending out an electronic component-mounted board 8 to the board transferring apparatus 221 after this mounting, and a controller 280 for controlling operation of the board transferring apparatus 221 and the component supply/mounting machine 210. According to the present second embodiment, the above unmounted board 7 corresponds to an example of unprocessed boards before being processed by the component-mounted board production apparatus and, the mounted board 8 corresponds to an example of process-finished boards after being processed by the component-mounted board production apparatus. There are included for the unmounted board 7 one case in which one circuit exerting one function is formed on the board, and another case in which a plurality of circuits each exerting the same function are formed on the board.

Although the controller 280 is illustrated in FIG. 10 to be separately arranged from the component mounting apparatus, the controller may be arranged inside the component mounting apparatus or may be arranged for each part constituting the component mounting apparatus.

Figure 12:
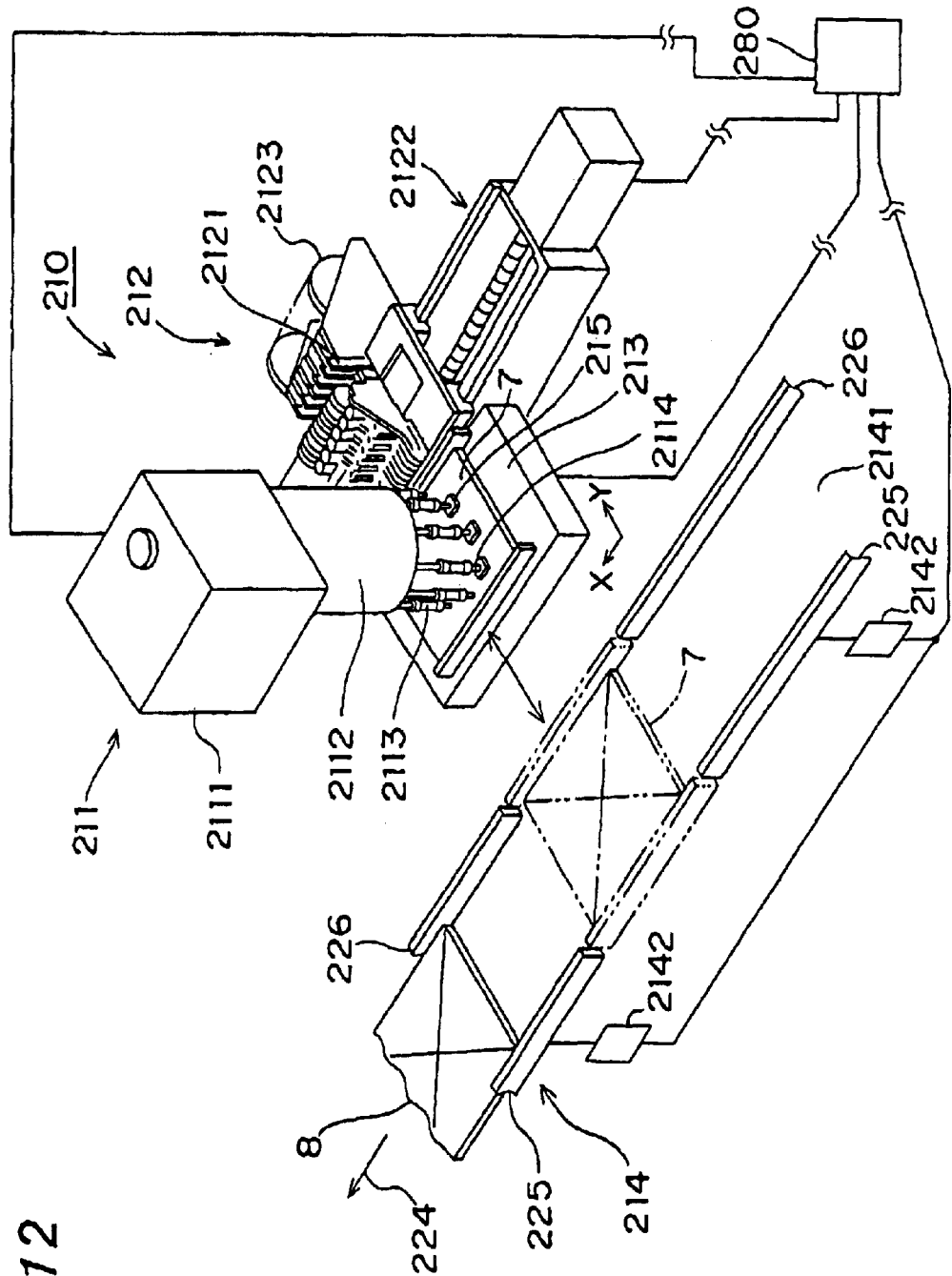
FIG. 12 is an oblique view showing structure of a component supply/mounting machine included in the component mounting apparatus shown in FIG. 10.

The component supply/mounting machine 210 is of a high-speed machine type of a so-called rotary form and includes, as shown in FIG. 12, a component hold/mounting unit 211, a component supply unit 212 for supplying electronic components to the component hold/mounting unit 211, an XY-table 213 movable in mutually orthogonal XY-directions where unmounted boards 7 are loaded, and a board supply/send unit 214 for supplying an unmounted board 7 to the XY-table 213 and sending out the unmounted board 7 from the XY-table 213.

The component hold/mounting unit 211 has a rotating device 2111 and a rotary part 2112 intermittently rotatable by a predetermined angle via the rotating device 2111, with a plurality of component hold/lift parts 2113 being arranged at a periphery of the rotary part 2112 at equal intervals to be movable up and down. The component hold/lift parts 2113 have component hold members 2114 attached to leading ends thereof for holding electronic components, e.g., by suction. The component hold/mounting unit 211 constituted as described above cannot move in the XY-directions.

The component supply unit 212 has component supply parts 2121 and a moving device 2122. The component supply parts have reels 2123 set for each kind of electronic components 215. Tapes with the electronic components 215 stored therein are wound about respective reels. The component supply parts let off tapes from respective reels 2123, thereby supplying electronic components 215. The moving device 2122 to which the component supply parts 2121 are secured moves the component supply parts 2121 in the X-direction so as to make the component hold/mounting unit 211 hold desired electronic component 215. Although two component supply units 212 are arranged in the present second embodiment, the number is not limited to this.

The board supply/send unit 214 has a board transfer passage 2141 and a driving device 2142 for transferring an unmounted board 7 and mounted board 8 along the board transfer passage 2141. The board transfer passage 2141, which is a passage extending in parallel along a transfer direction 224 of the unmounted board 7 and mounted board 8, is formed of a fixed side rail 225 and a movable side rail 226 and can be fitted to boards 7, 8 of various sizes by moving the movable side rail 226 in a breadth direction of boards 7, 8. The fixed side rail 225 and the movable side rail 226 are provided with belt conveyors capable of supporting opposite side edge portions of the boards 7, 8. The boards 7, 8 are transferred in the aforementioned transfer direction 224 by driving each belt conveyor by the driving device 2142.

Each of the above-described component hold/mounting unit 211, the component supply unit 212, the XY-table 213 and the board supply/send unit 214 is connected to the controller 280 to be controlled in operation by the controller 280.

In the component supply/mounting machine 210 of the above constitution, electronic components 215 are supplied and mounted by operations as will be described below. Initially, an unmounted board 7 is placed on the XY-table 213 by the board supply/send unit 214, the unmounted board 7 is moved to below the rotary part 2112 by the XY-table 213 and is positioned so that a mounting preparation position of the rotary part 2112 agrees with a mounting position on the unmounted board 7. Meanwhile, the component supply part 2121 which is to supply a desired electronic component 215 is positioned by the moving device 2122 to a component hold position where the component hold member 2114 is to hold the electronic component 215 received from the component supply part 2121, and the component hold/lift part 2113 moves down to hold the electronic component 215 by the component hold member 2114. After this holding, the component hold/lift part 2113 moves up and the rotary part 2112 is rotated by the rotating device 2111, thereby disposing the component hold/lift part 2113 to the mounting preparation position for mounting the held electronic component 215 to the board 7. Next, the component hold/lift part 2113 is moved down to mount the electronic component 215 to the mounting position on the board 7. After this mounting, the component hold/lift part 2113 moves up and is arranged at the component hold position again by rotation of the rotary part 2112.

Electronic components 215 are sequentially mounted onto the unmounted board 7 by component hold members 2114 through a repetition of the above-described operation.

According to the present second embodiment, the component supply/mounting machine 210 is a high-speed machine type of the so-called rotary form. However, the machine is not limited to this type, and various known component supply/mounting machines such as a so-called multi-function type in which, for example, a mounting head part with component hold members 2114 is freely movable in XY-directions and can supply components also from trays, or the like, may be adopted.

Hereinbelow will be described the above-mentioned board transferring apparatus 221.

The board transferring apparatus 221 has one board transfer path 2211 for transferring an unmounted board 7, to be processed by the above described component supply/mounting machine 210, and a mounted board 8 processed by the component supply/mounting machine 210. Moreover, the board transferring apparatus includes a board carry-in device 2212 which moves between the board transfer path 2211 and the component supply/mounting machine 210, thereby carrying an unmounted board 7 to the component supply/mounting machine 210, and further includes a board send-out device 2222 which moves between the board transfer path 2211 and the component supply/mounting machine 210, thereby sending out a mounted board 8 from the component supply/mounting machine 210 to the board transfer path 2211. The board transferring apparatus also includes an identifying device 2215 disposed at the board transfer path 2211 for recognizing carry-in propriety display parts 2216 on the boards 7, 8, which represent whether or not the unmounted board 7 and the mounted board 8 can be sent into the component supply/mounting machine 210, and also includes the controller 280 for controlling operations of the board carry-in device 2212, the board send-out device 2222 and the identifying device 2215, and also judging whether or not the boards 7, 8 are to be carried into the component supply/mounting machine 210 by controlling operation of the board carry-in device 2212 based on an identification result obtained by identifying the carry-in propriety display part 2216 by the identify device 2215.

The board transfer path 2211 is constituted of a fixed side rail 225 and a movable side rail 226 extending parallel along the transfer direction 224 of unmounted board 7 and mounted board 8, functioning as a bypass line of the board transfer passage 2141. The board transfer path 2211 can be conformed to unmounted boards 7 and mounted boards 8 of various sizes by moving the movable side rail 226 in a breadth direction of the boards 7 and 8. Belt conveyors capable of supporting opposite side edge portions of an unmounted board 7 and mounted board 8 are equipped to each of the fixed side rail 225 and the movable side rail 226. The unmounted board 7 and mounted board 8 are transferred in the above transfer direction 224 by driving each of the conveyors by a driving device 2213.

Figure 11:
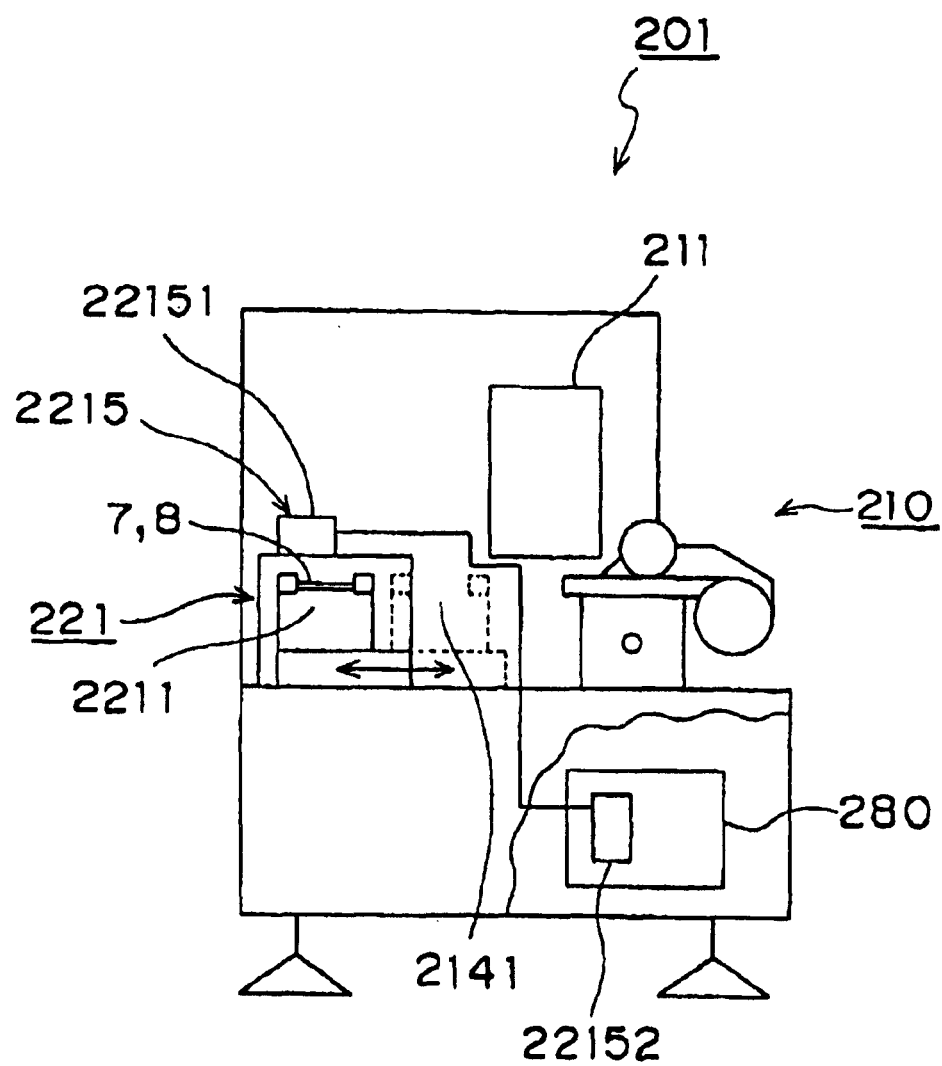
FIG. 11 is a side view of the component mounting apparatus shown in FIG. 10.
Figure 13:
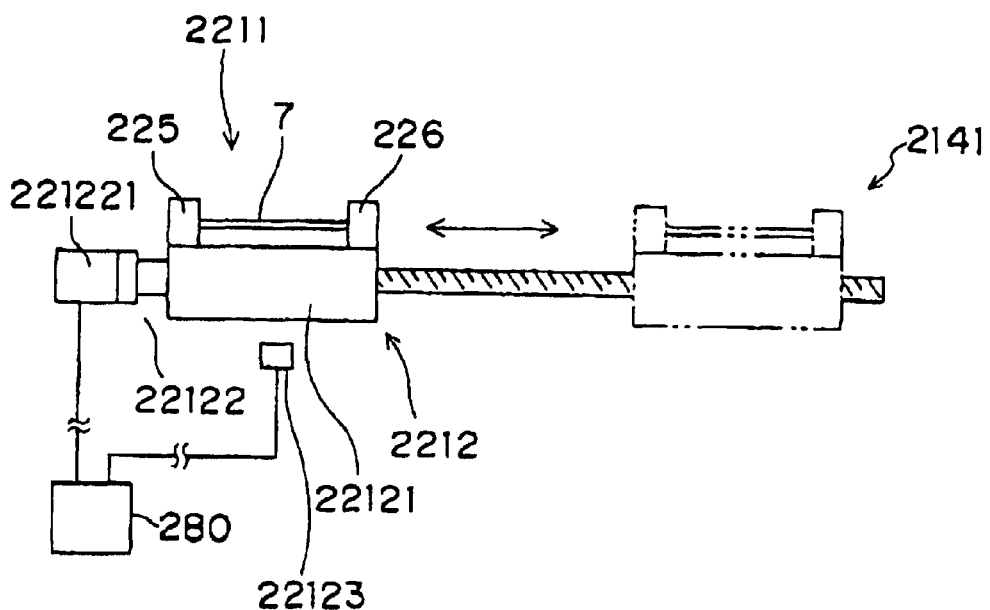
FIG. 13 is a diagram showing structure of a board carry-in device included in the component mounting apparatus shown in FIG. 10.

The board carry-in device 2212 has, as shown in FIG. 13, a supply side board hold part 22121 and a drive part 22122. As indicated in FIGS. 11 and 13, since the board transfer path 2211 and the board transfer passage 2141 are arranged to be an equal height in the second embodiment, the drive part 22122 reciprocates the supply side board hold part 22121 between the board transfer path 2211 and the board transfer passage 2141. According to the second embodiment, a sensor 22123, for instance, a limit switch, a proximity sensor or the like, for detecting that the supply side board hold part 22121 is positioned at the board transfer path 2211, is installed, so that an arrangement position of the supply side board hold part 22121 is determined by the controller 280 based on a signal supplied from the sensor 22123 to the controller 280.

The drive part 22122 is constructed from a structure including a ball screw in the second embodiment, having a motor 221221 corresponding to a driving source controlled in operation by the controller 280. The supply side board hold part 22121 has the fixed side rail 225 and the movable side rail 226, thus forming part of the board transfer path 2211 when arranged at the board transfer path 2211 and forming part of the board transfer passage 2141 when arranged at the board transfer passage 2141.

The above-constituted board carry-in device 2212 operates as will be discussed below. The supply side board hold part 22121, which is normally arranged at the board transfer path 2211, holds an unmounted board 7 between the fixed side rail 225 and the movable side rail 226 of the supply side board hold part 22121 when it is necessary to send this transferred unmounted board 7 to the component supply/mounting machine 210, and moves the unmounted board 7 by the drive part 22122 to the board transfer passage 2141. The unmounted board 7 moved to the board transfer passage 2141 is subjected to a mounting operation. In the meantime, the supply side board hold part 22121 returns to the board transfer path 2211 after sending the unmounted board 7 to the board transfer passage 2141. When it is not necessary to carry the unmounted board 7 into the component supply/mounting machine 210, the unmounted board 7 passes the supply side board hold part 22121.

Figure 14:
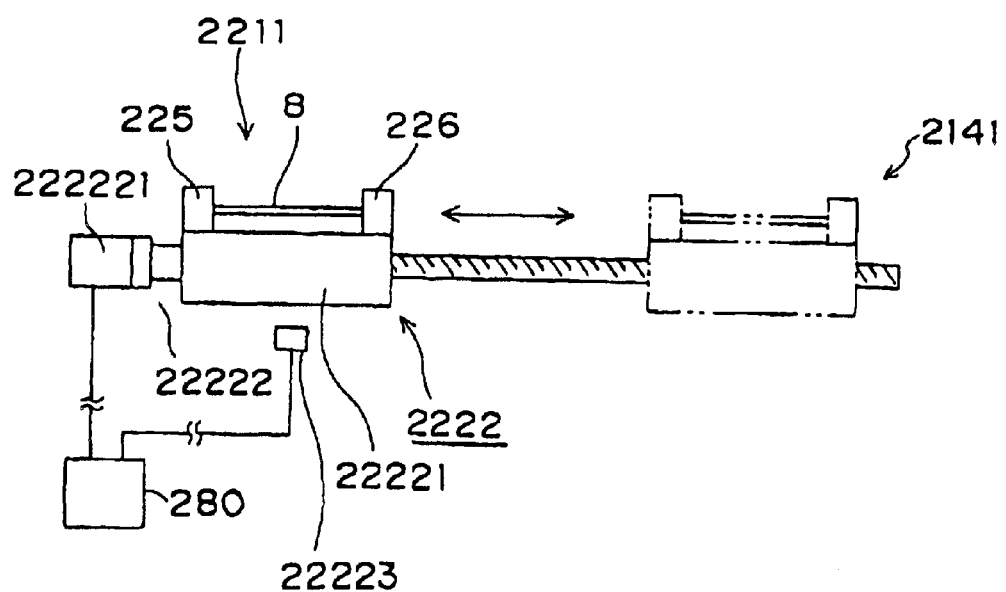
FIG. 14 is a diagram showing structure of a board send-out device included in the component mounting apparatus shown in FIG. 10.

As shown in FIG. 14, the board send-out device 2222 has a discharge side board hold part 22221 and a drive part 22222. The drive part 22222 reciprocates the discharge side board hold part 22221 between the board transfer path 2211 and the board transfer passage 2141. In the present second embodiment, for instance, a sensor 22223 such as a limit switch, a proximity sensor or the like is installed to detect that the discharge side board hold part 22221 is positioned at the board transfer path 2211, and an arrangement position of the discharge side board hold part 22221 is determined by the controller 280 on a basis of a signal supplied to the controller 280 from the sensor 22223.

The drive part 22222 is formed from a structure including a ball screw in the second embodiment, and a motor 222221 corresponding to a driving source is controlled in operation by the controller 280. The discharge side board hold part 22221 includes the fixed side rail 225 and the movable side rail 226, thereby forming part of the board transfer path 2211 when positioned at the board transfer path 2211 and forming part of the board transfer passage 2141 when positioned at the board transfer passage 2141.

The above-constituted board send-out device 2222 operates as will be described below. The discharge side board hold part 22221 normally arranged at the board transfer path 2211 is moved by the drive part 22222 from the board transfer path 2211 to the board transfer passage 2141 when a mounted board 8 is to be sent out from the component supply/mounting machine 210. After being positioned at the board transfer passage 2141, the discharge side board hold part 22221 holds the mounted board 8 between the fixed side rail 225 and the movable side rail 226 of the discharge side board hold part 22221, and then is moved from the board transfer passage 2141 to the board transfer path 2211. The mounted board 8 sent to the board transfer path 2211 is transferred by the driving device 2213 along the board transfer path 2211 in the transfer direction 224.

The identifying device 2215, which is one of feature characteristics of the board transferring apparatus 221 of the second embodiment and identifies the carry-in propriety display part 2216 on board 7, 8 as mentioned earlier, will be described next.

Figure 15:
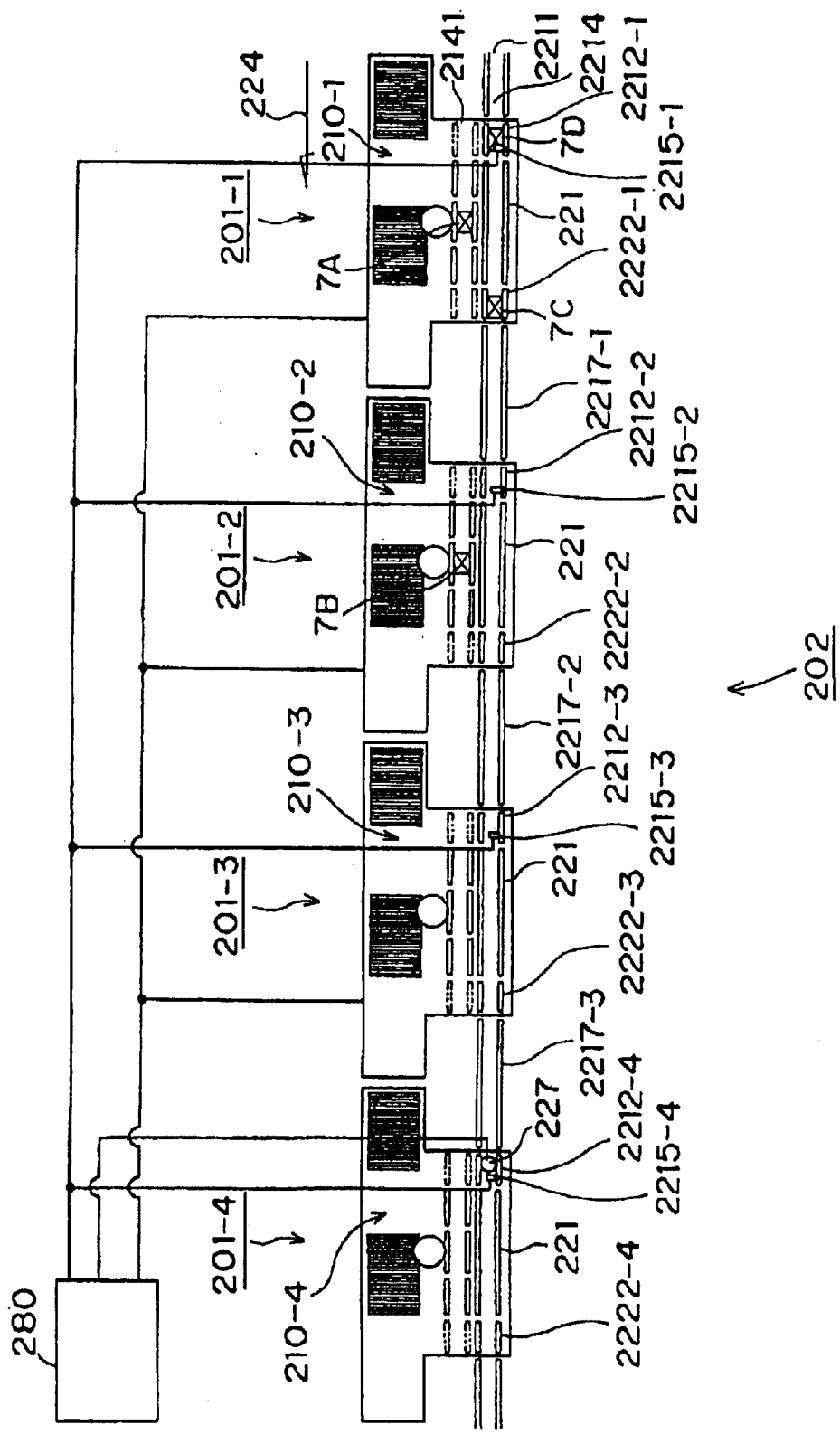
FIG. 15 is a diagram for explaining a component mounting operation performed by a component mounting apparatus constituted of four component mounting apparatuses of FIG. 10 arranged in series.

Carry-in propriety display part 2216 is a part indicative of supply-propriety information showing whether or not an unmounted board 7 and a mounted board 8, transferred along the board transfer path 2211, are to be sent to the component supply/mounting machine 210, and moreover indicating component supply/mounting machine 210 of the component mounting apparatuses 201 to which the unmounted board 7 and the mounted board 8 are to be supplied, for instance, when a plurality of component mounting apparatuses 201 are arranged in series along the transfer direction 224 as shown in FIG. 15. The display part 2216 is formed of a bar code in the second embodiment and attached, e.g., to an end part on a mounting face of boards 7, 8 where electronic components 215 are mounted, as shown in FIG. 10. Form of the carry-in propriety display part 2216 is not limited to the above bar code and can be any kind of form so long as each board can be identified, for example, a geometrical shape such as a circle, a triangle, a quadrilateral or the like, a pattern of a die or the like, a board number formed on boards 7, 8, a wiring pattern, a part processed by the component-mounted board production apparatus, namely, a part on the board where components are mounted according to the second embodiment, and the like. The carry-in propriety display part 2216 is preferably formed in a state in which supply-propriety information can be rewritten to cope with a change in production form to be described later, and the like. For example, an IC memory or the like is included in the carry-in propriety display part 2216 accordingly.

As indicated in FIG. 11, the identifying device 2215 for identifying the above described carry-in propriety display part 2216 has a detect part 22151 and a determination part 22152. Since the determination part 22152 is included in the controller 280 in the constitution adopted according to the second embodiment, the detect part 22151 corresponds to the above identifying device 2215. The detect part 22151 is a device for detecting carry-in propriety display part 2216 and is a generally used bar code reader using LEDs (light-emitting diode) in the second embodiment. The identifying device 2215 may have a function for rewriting supply-propriety information. According to the second embodiment as indicated in FIG. 10, the detect part 22151 is arranged above the supply side board hold part 22121 positioned at the board transfer path 2211, so that it can detect carry-in propriety display part 2216 of boards 7, 8 when the boards 7, 8 are disposed at the carry side board hold part 22121 positioned at the board transfer path 2211. A position where to arrange the detect part 22151 is not limited to that described above. The detect part 22151 may be arranged at a position before boards 7, 8 are carried into the component mounting apparatus 201, for example, may be arranged above a stop region 2214 so that it can detect carry-in propriety display part 2216 of boards 7, 8 when the boards 7, 8 are arranged at the stop region 2214 formed immediately before the board carry-in device 2212 in the transfer direction 224.

The determination part 22152 decides on the basis of an identification result of the carry-in propriety display part 2216, by the detect part 22151, whether or not boards 7, 8 are to be carried to the component supply/mounting machine 210 and controls operation of the board carry-in device 2212.

A detailed operation of a component mounting operation of the identifying device 2215 constituted as described above will be described later.

One component mounting apparatus 201 is thus formed in the above-discussed arrangement. A modified example as will be described below can be constructed.

Specifically, as a component mounting apparatus 202 shown in FIG. 15, a plurality of component mounting apparatuses 201-1, 201-2, . . . can be arranged in series in transfer direction 224. In the second embodiment, since both unmounted board 7 and mounted board 8 are transferred along one board transfer path 2211, with a plurality of component mounting apparatuses arranged, it is necessary to prevent the board 7 from not being supplied to any of component supply/mounting machines 210-1, 210-2, . . . and being carried out of the component mounting apparatus 202 without having components mounted thereto, for example, as a result of a detection error of a corresponding one of identifying devices 2215-1, 2215-2, . . . A processing part in the component-mounted board production apparatus, i.e., a recognizing device 227, which detects presence/absence of components on a board in the second embodiment, is preferably arranged corresponding to a component-mounted board production apparatus, located at a trail end in the transfer direction 224, from among the plurality of component mounting apparatuses. The recognizing device 227 is connected to controller 280, and the controller 280 controls operation of the component mounting apparatus 201-4 at the trail end based on information from the recognizing device 227.

Figure 16:
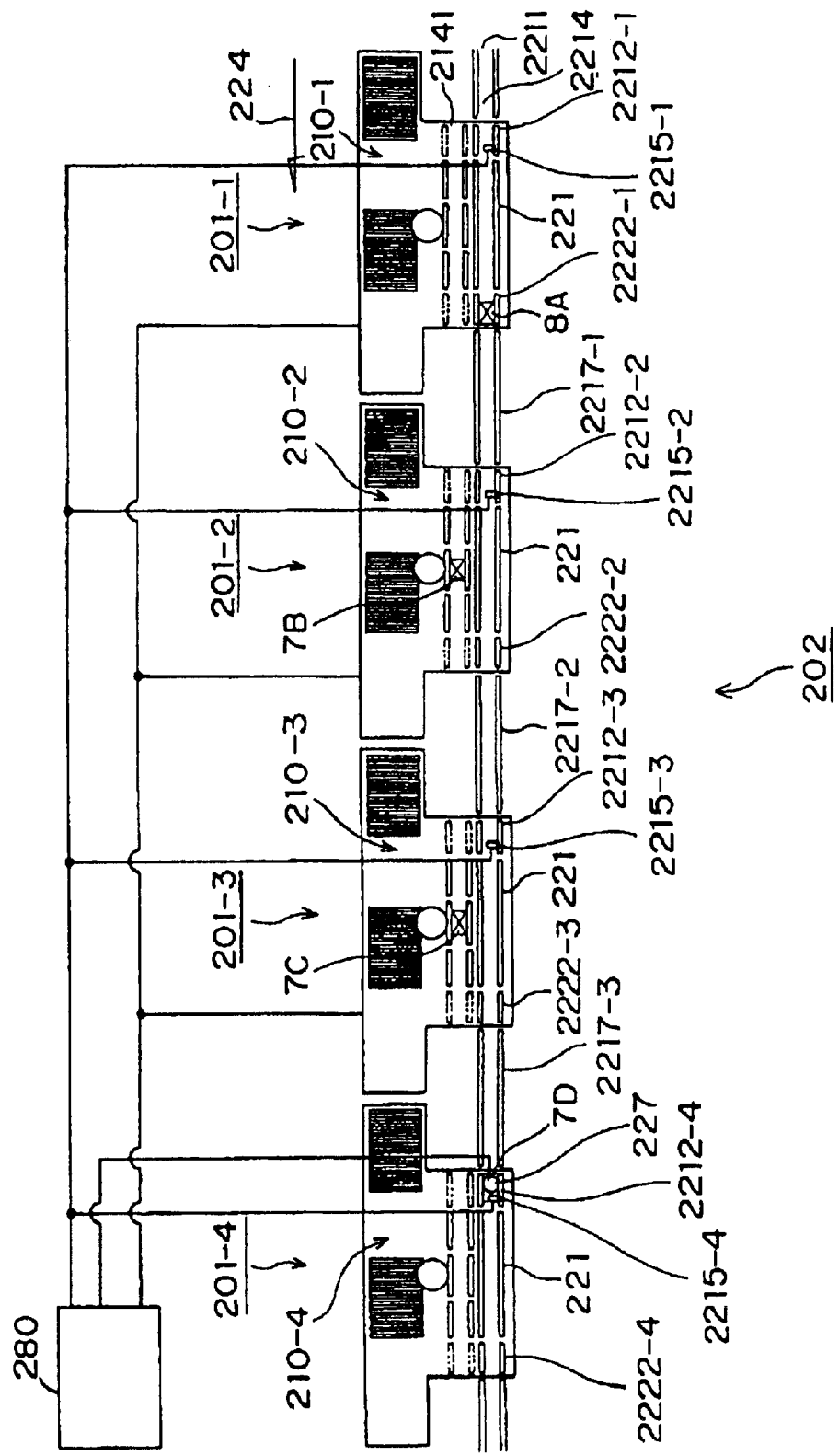
FIG. 16 is a diagram for explaining a component mounting operation performed by a component mounting apparatus constituted of four component mounting apparatuses of FIG. 10 arranged in series.
Figure 17:
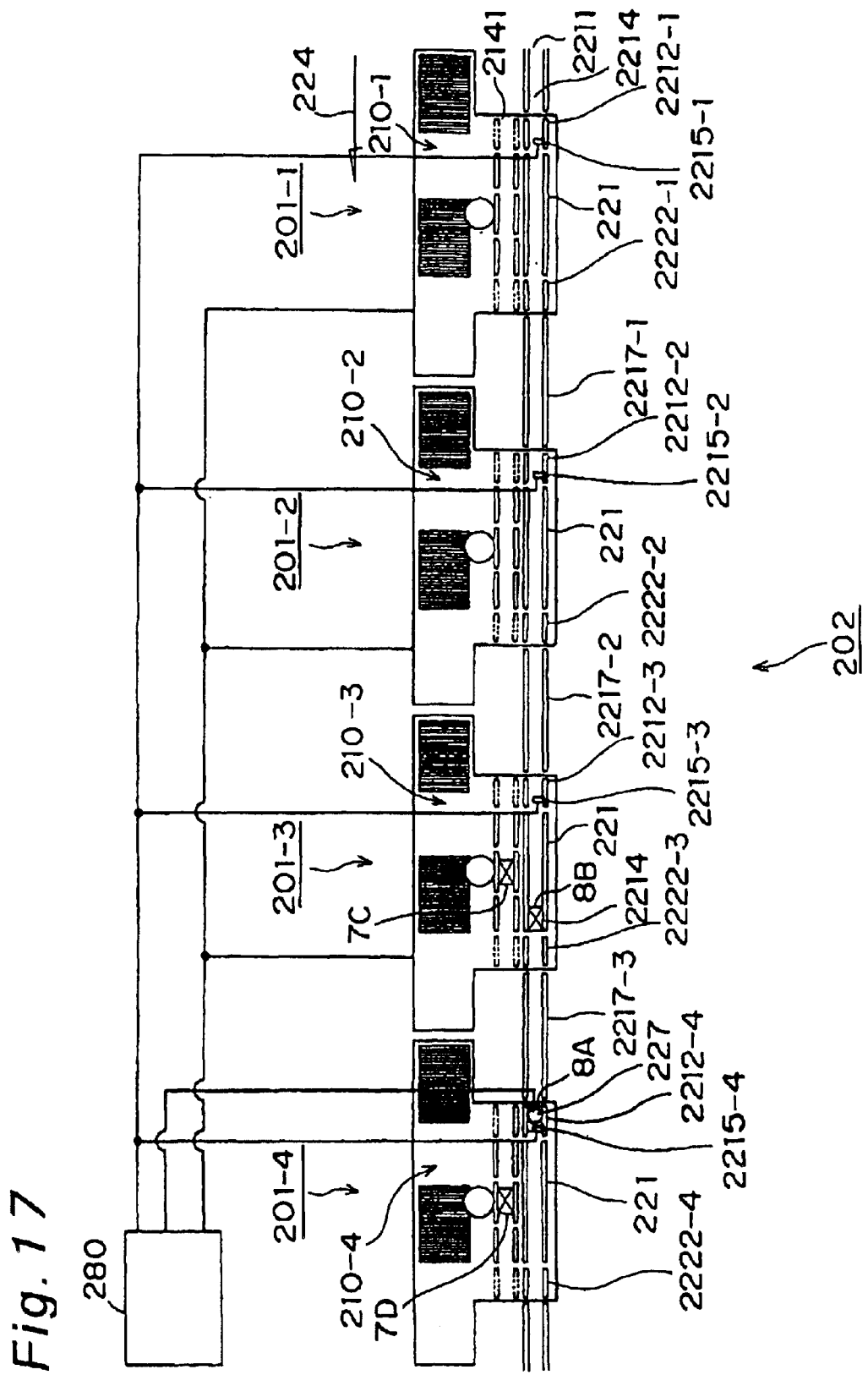
FIG. 17 is a diagram for explaining a component mounting operation performed by a component mounting apparatus constituted of four component mounting apparatuses of FIG. 10 arranged in series.

Component mounting operation in the above-described component mounting apparatus will be described below by taking as an example a component mounting apparatus 202 having four component mounting apparatuses 201-1 to 201-4 arranged in series along the transfer direction 224 as shown in FIGS. 15–17. It is to be noted here that a component mounting operation for an unmounted board 7 in the component supply/mounting machine of each component mounting apparatus is similar to the conventional operation and will be briefly described.

In addition, all performances of the component mounting operation are controlled by the controller 280. In other words, a program in relation to the mounting operation, such as a relationship between mounting positions on unmounted board 7 and electronic components 215 to be mounted to the mounting positions, a mounting order, and the like are stored in the controller 280. The controller 280 controls operation of each component supply/mounting machine and also controls operations of board transferring apparatus 221 including board carry-in devices 2212-1, 2212-2, . . . and board send-out devices 2222-1, 2222-2, and identifying devices 2215-1, 2215-2, . . .

In the following description, unmounted boards 7 transferred from an upstream side of the component mounting apparatus 202 are identical to each other, and four unmounted boards 7A, 7B, 7C, 7D are transferred in this order. A carry-in propriety display part 2216A with information, so that the unmounted board 7A is supplied to the component mounting apparatus 201-1, is attached to the unmounted board 7A; a carry-in propriety display part 2216B with information, so that the unmounted board 7B is supplied to the component mounting apparatus 201-2, is attached to the unmounted board 7B; a carry-in propriety display part 2216C with information, so that the unmounted board 7C is supplied to the component mounting apparatus 201-3, is attached to the unmounted board 7C; and a carry-in propriety display part 2216D with information, so that the unmounted board 7D is supplied to the component mounting apparatus 201-4, is attached to the unmounted board 7D.

The component mounting apparatuses 201-1 to 201-4 are constructed to mount equal components.

The first unmounted board 7A transferred on the board transfer path 2211 by driving device 2213, for transferring unmounted boards from the upstream side of the component mounting apparatus 202, is temporarily stopped by the supply side board hold part 22121 arranged at the board transfer path 2211 of the board carry-in device 2212-1 of the component mounting apparatus 201-1. As described before, since the controller 280 confirms an arrangement position of the supply side board hold part 22121 based on a signal from the sensor 22123, unless the supply side board hold part 22121 is positioned at the board transfer path 2211, the controller 280 controls operation of the driving device 2213 to stop the unmounted board 7A at the stop region 2214, and then the unmounted board 7A is carried to the supply side board hold part 22121 after the supply side board hold part 22121 is positioned at the board transfer path 2211.

After the unmounted board 7A is carried to the supply side board hold part 22121, the identifying device 2215-1 recognizes the carry-in propriety display part 2216A of the unmounted board 7A, and the controller 280 determines, based on information from the carry-in propriety display part 2216A, whether or not the unmounted board 7A is to be supplied to the component mounting apparatus 201-1. In this case, information of supplying the unmounted board 7A to the component mounting apparatus 201-1 is described in the carry-in propriety display part 2216A, and therefore the controller 280 controls operation of the motor 221221 of the board carry-in device 2212-1 for arranging the supply side board hold part 22121 at the board transfer passage 2141 so as to supply the unmounted board 7A to the component mounting apparatus 201-1, and after this arranging the controller 280 transfers the unmounted board 7A along the board transfer passage 2141. The supply side board hold part 22121 returns to the board transfer path 2211 after the unmounted board 7A is carried to the board transfer passage 2141.

The unmounted board 7A is transferred along the board transfer passage 2141 to the XY-table 213 arranged at the board transfer passage 2141, placed on the XY-table 213, positioned to a predetermined position and held. After the board is held to the XY-table 213, the XY-table 213 is arranged below component hold/mounting unit 211. After this arrangement, an electronic component 215 is mounted onto the unmounted board 7A by the component supply/mounting machine 210-1 as described earlier. More specifically, the unmounted board 7A on the XY-table 213 is positioned so that a mounting position on the unmounted board 7A agrees with a mounting preparation position of rotary part 2112, and at the same time, component supply part 2121 is positioned by moving device 2122 to the component hold position where component hold member 2114 is to hold the electronic component 215 received from the component supply part 2121. After the component hold member 2114 holds the electronic component 215 at the component hold position, the rotary part 2112 rotates to the mounting preparation position, whereby the electronic component 215 is mounted to the mounting position of the unmounted board 7A. The component hold member 2114 moves up after this mounting and is arranged at the component hold position again through rotation of the rotary part 2112. Electronic components 215 are sequentially mounted to respective mounting positions on the unmounted board 7A by component hold members 2114 of the rotary part 2112 in this manner.

On the other hand, while the electronic components 215 are mounted onto the unmounted board 7A, boards 7B, 7C, 7D are sequentially temporarily stopped by the supply side board hold part 22121 of the component mounting apparatus 201-1, and the carry-in propriety display parts 2216B, 2216C, 2216D are recognized by the recognizing device 2215-1. Since the carry-in propriety display parts 2216B, 2216C, 2216D do not include information of ordering supply to the component mounting apparatus 201-1, each of the unmounted boards 7B, 7C, 7D is determined as not to be taken into the component mounting apparatus 201-1, and is carried to the component mounting apparatus 201-2 by being passed along the board transfer path 2211 through the supply side board hold part 22121, the discharge side board hold part 22221 of the component mounting apparatus 201-1, and a path 2217-1 for connection.

Similar to the earlier-described supply and mounting operation for the unmounted board 7A at the component mounting apparatus 201-1, the unmounted board 7B is permitted to be supplied to the component supply/mounting machine 210-2 of the component mounting apparatus 201-2 through a recognition operation performed by the recognizing device 2215-2 included in the component mounting apparatus 201-2, and subjected to a mounting operation by the component supply/mounting machine 210-2. The unmounted board 7C is permitted to be supplied to the component supply/mounting machine 210-3 of the component mounting apparatus 201-3 by a recognition operation of the recognizing device 2215-3 of the component mounting apparatus 201-3, and subjected to a mounting operation by the component supply/mounting machine 210-3. For the unmounted board 7D, supply to the component supply/mounting machine 210-4 of the component mounting apparatus 201-4 is permitted by a recognition operation of the recognizing device 2215-4 of the component mounting apparatus 201-4, so that components are mounted to board 7D by the component supply/mounting machine 210-4.

In the meantime, mounted board 8A, formed by mounting all of predetermined electronic components 215 to the unmounted board 7A, is transferred from the XY-table 213 to board supply/send unit 214, further sent to discharge side board hold part 22221, arranged at the board transfer passage 2141, of board send-out device 2222-1 of the component mounting apparatus 201-1, and then held by the discharge side board hold part 22221. This mounted board is then returned to the board transfer path 2211 by the discharge side board hold part 22221.

While the unmounted boards 7B, 7C, 7D are transferred along the board transfer path 2211 as described above, the controller 280 controls a transfer operation for each board so as to prevent interference of transfer of the unmounted boards 7B, 7C, 7D with transfer of the mounted board 8A, and to be able to shorten a Tact. For example, a state is shown in FIG. 15 in which, during the mounting operation of the unmounted board 7A performed by the component mounting apparatus 201-1, the unmounted board 7B is supplied to the component supply/mounting machine 210-2 of the component mounting apparatus 201-2, the unmounted board 7C is disposed at the discharge side board hold part 22221 of the board send-out device 2222-1 of the component mounting apparatus 201-1, and the unmounted board 7D is arranged at the supply side board hold part 22121 of the board carry-in device 2212-1 of the component mounting apparatus 201-1.

The controller 280 determines that it is possible to supply a next unmounted board 7 to the component supply/mounting machine 210-1 on a basis of factors such as boards 7, 8 being absent from the XY-table 213, the component supply/mounting machine 210-1 being at rest, or the like.

FIG. 16 indicates a state wherein the mounted board 8A is arranged on the board transfer path 2211 while held by the discharge side board hold part 22221 of the component mounting apparatus 201-1, while the unmounted board 7B is being subjected to a mounting operation performed by the component supply/mounting machine 210-2 of the component mounting apparatus 201-2, and the unmounted board 7C is in the middle of a mounting operation performed by the component supply/mounting machine 210-3 of the component mounting apparatus 201-3, with the unmounted board 7D being arranged at the supply side board hold part 22121 of the board carry-in device 2212-4 of the component mounting apparatus 201-4.

FIG. 17 represents a state in which the mounted board 8A is transferred to the discharge side board hold part 22221 of the board send-out device 2222-4 of the component mounting apparatus 201-4, and the mounted board 8B is transferred to the stop region 2214 located immediately before the board send-out device 2222-4 of the component mounting apparatus 201-3, while the unmounted board 7C is being subjected to a mounting operation by the component supply/mounting machine 210-3 of the component mounting apparatus 201-3 and the unmounted board 7D is being subjected to a mounting operation by the component supply/mounting machine 210-4 of the component mounting apparatus 201-4.

As is shown in FIG. 17, when a mounted board is transferred and temporarily stopped at the discharge side board hold part 22221 of the board send-out device 2222-4 of the component mounting apparatus 2014, presence/absence of mounted components is detected by the recognizing device 227 in addition to an identification operation performed by the identifying device 2215-4. When the controller 280 determines presence of mounted components based on output information of the recognizing device 227, this board is directly transferred to a next process along the board transfer path 2211 in the transfer direction 224. The next process is, for example, a soldering process or the like. In contrast, when an absence of a mounted component is decided, the controller 280 controls operation of each part so as to supply the board, determined to have no component, to the component supply/mounting machine 210-4 of the component mounting apparatus 201-4 and have components mounted to the board because the component mounting apparatuses 201-1 to 201-4 are designed to mount equal components in the present second embodiment as mentioned before.

Similar to the above-described mounted board 8A, presence/absence of mounted components is detected for the mounted boards 8B, 8C by the recognizing device 227, and operation based on this detected result is performed.

As discussed hereinabove, in the component mounting apparatus 202 with the board transferring apparatus 221 of the second embodiment, when a plurality of component supply/mounting machines 210 are arranged along the transfer direction 224, and moreover each of the component supply/mounting machines 210 mounts all components necessary for one complete board, a necessary time for loading boards 7 to each of the component supply/mounting machines 210 is a time for loading one board to one component supply/mounting machine 210 irrespective of the number of the component supply/mounting machines 210. A production time per board can be accordingly shortened and a production efficiency of the component mounting apparatus can be improved. The embodiment is the same as the conventional component mounting apparatus of FIG. 9 from this view point. However, the conventional component mounting apparatus requires two paths for transferring boards 7, 8 as a bypass route of board transfer passage 2141 in the component supply/mounting machine 210. In contrast, one board transfer path 2211 is sufficient in the component mounting apparatus of the present second embodiment, thereby enabling curtailing an apparatus constitution, an apparatus cost, and the like.

Figure 9:
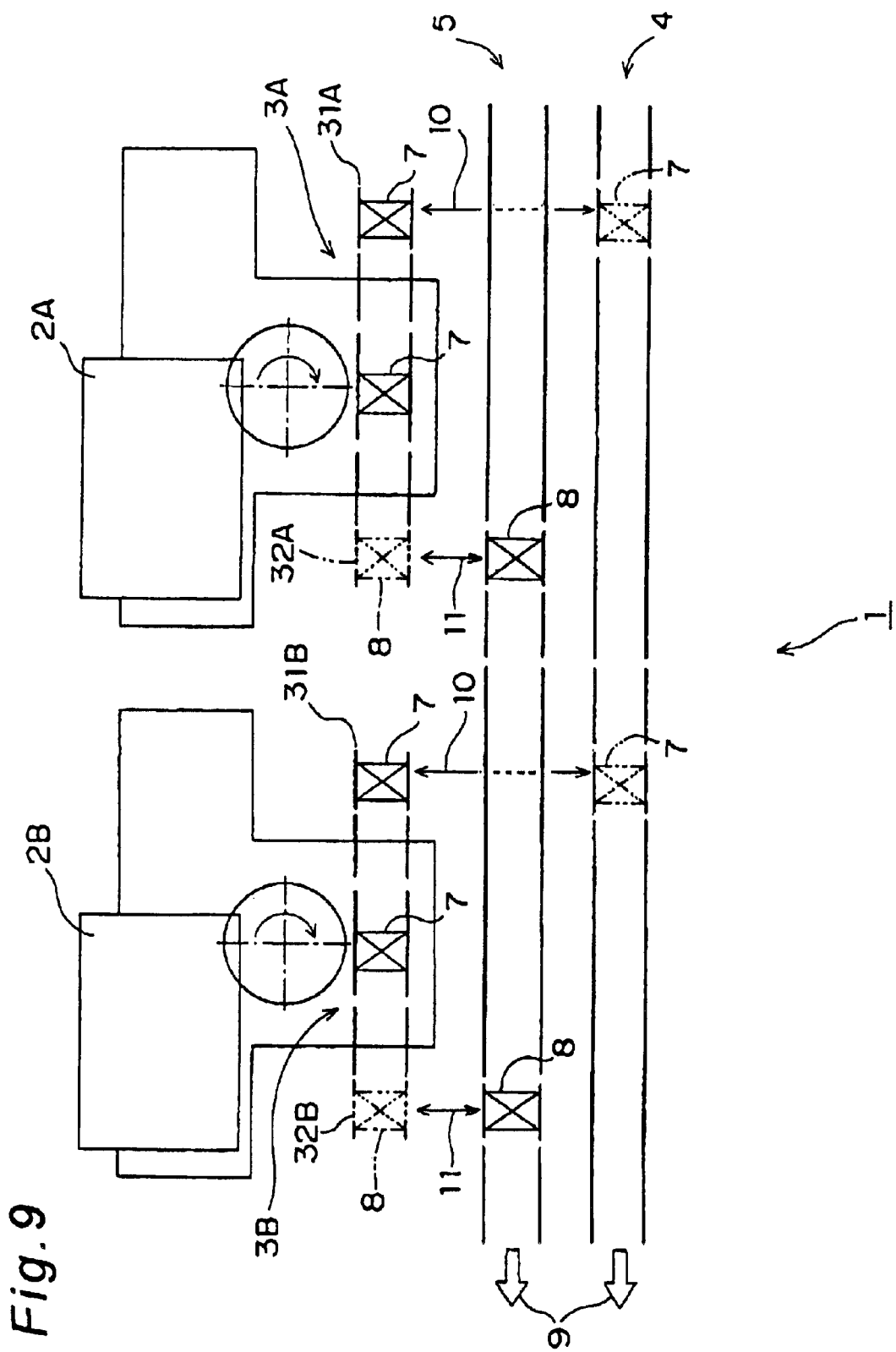
FIG. 9 is a diagram showing structure of a conventional component mounting apparatus.

Furthermore, in the component mounting apparatus 201, 202 having the board transferring apparatus 221 of the second embodiment, as compared with the conventional component mounting apparatus shown in FIG. 9, special effects as follows can be exhibited.

Each of boards 7, 8 has carry-in propriety display part 2216 applied thereto, so that the component mounting apparatus 201 to which the board is supplied is specified. Therefore, for example, the component mounting apparatus 201 which mounts components to mounted board 8 including a mounting failure can be specified.

According to the present second embodiment, the component mounting apparatus 201 arranged at the trail end is equipped with the recognizing device 227, so that board 7 without components mounted thereto due to, e.g., machine trouble, an identification error at the identifying device 2215 or the like can be detected. An error of transferring unmounted board 7 to a next process at a down-stream side can hence be prevented.

In the event that all components necessary for one complete board cannot be mounted by one component mounting apparatus 201, for example, even when part of the electronic components are mounted by the component mounting apparatuses 201-1, 201-2 and remaining electronic components are mounted by the component mounting apparatuses 201-3, 201-4, thereby finishing one printed board in the component mounting apparatus 202 shown in FIG. 15, it is possible to produce a finished board in the above board transfer path 2211 without constructing a fresh mounting line. Moreover, even if boards to be produced change, production efficiency can be improved in accordance with types of boards to be produced without greatly changing a layout in a factory, including a layout of a board production line, incidental facilities, and the like, which will be discussed in detail below.

In a case of mounting part of electronic components by the component mounting apparatuses 201-1, 201-2 and mounting remaining electronic components by the component mounting apparatuses 201-3, 201-4 to complete one printed board, the following operation is performed given that carry-in propriety display part 2216A of unmounted board 7A has information that the unmounted board 7A can be supplied to each of the component supply/mounting machines 210-1, 210-3 of the component mounting apparatuses 201-1, 201-3, while carry-in propriety display part 2216B of unmounted board 7B includes information that the unmounted board 7B can be supplied to each of component supply/mounting machines 210-2, 210-4 of the component mounting apparatuses 201-2, 2014.

With this arrangement, the carry-in propriety display part 2216A of the unmounted board 7A transferred along the transfer path 2211 is identified by the identifying device 2215-1 of the component mounting apparatus 201-1 as described before, whereby supply of board 7A to the component supply/mounting machine 210-1 is permitted on a basis of this identified result. The unmounted board 7A is subjected to mounting by the component supply/mounting machine 210-1. During this mounting operation of the unmounted board 7A, the carry-in propriety display part 2216B of the unmounted board 7B is identified by the identifying device 2215-2 of the component mounting apparatus 201-2, and supply of board 7B to the component supply/mounting machine 210-2 is permitted on a basis of this identified result. The mounting operation of the unmounted board 7B is performed by the component supply/mounting machine 210-2.

Mounted board 8A produced by the mounting operation of the unmounted board 7A in the component supply/mounting machine 210-1 is returned by the board carry-in device 2222-1 to the transfer path 2211 and transferred along the board transfer path 2211 in the transfer direction 224. Information described in the carry-in propriety display part 2216A of the mounted board 8A is not information permitting supply thereof to the component supply/mounting machine 210-2 of the component mounting apparatus 201-2, and consequently the mounted board 8A passes the component mounting apparatus 201-2 so as to be transferred to the supply side board hold part 22121 of the component mounting apparatus 201-3. The carry-in propriety display part 2216A is identified by the identifying device 2215-3 of the component mounting apparatus 201-3, and supply of the mounted board 8A to the component supply/mounting machine 210-3 is permitted on a basis of this identified result. Remaining components are mounted to the mounted board 8A by the component supply/mounting machine 210-3.

The same control operation as for the above-described mounted board 8A is executed for mounted board 8B produced by a mounting operation of the unmounted board 7B performed by the component supply/mounting machine 210-2, whereby remaining components are mounted to the mounted board 8B by the component supply/mounting machine 210-4 of the component mounting apparatus 201-4.

After the mounting operation of the mounted board 8A in the component supply/mounting machine 210-3 and the mounting operation of the mounted board 8B in the component supply/mounting machine 210-4 are respectively finished, each mounted board 8A, 8B is returned to the board transfer path 2211 and is transferred along the board transfer path 2211 in the transfer direction 224 so as to be supplied to a next process.

Since supply propriety to the component supply/mounting machine 210 is identified for each of transferred boards 7, 8 by the identifying device 2215 as described above, there is no need of constructing a fresh mounting line to mount remaining components. Moreover, even if printed boards to be produced vary, the component mounting apparatus 202 of the present second embodiment can be used by changing a type of components to be mounted by each component supply/mounting machine 210, and by changing supply-propriety information of the component mount/setting machine 210 which is described in each carry-in propriety display part 2216 of board 7. In other words, information of supply propriety of the component supply/mounting machine 210 which is described in each carry-in propriety display part 2216 of each board 7 is designed to conform with a mounting program stored in the controller 280 based on the constitution of the component mounting apparatus and a number of electronic components to be mounted.

According to the board transferring apparatus 221 of the present second embodiment as discussed hereinabove, production efficiency can be improved in accordance with types of boards to be produced without greatly changing a layout in a factory, including a layout of a board production line and incidental facilities, and the like.

The above-described case, that all of electronic components to be mounted to a printed board to be produced are not completely mounted by one component mounting apparatus, corresponds not only to a case where one component mounting apparatus 201 cannot have the number of component supply parts 2121 which supply components of a necessary number to form one printed board, but also to a case where different electronic components are used only partly and common electronic components are used for a remainder among models of boards, for instance, for portable phones, personal computers, and the like. When only part of the electronic components are different, common electronic components are mounted, e.g., by a plurality of component mounting apparatuses 201 arranged, e.g., at an upstream side, thereby forming mounted boards 8 including the common electronic components. Then the mounted boards 8 are transferred to, e.g., a plurality of component mounting apparatuses 201 disposed at a downstream side, where each of supply proprieties, of component supply/mounting machines 210 included in respective component mounting apparatuses 201, is determined with use of the identifying devices 2215. Therefore, different electronic components can be mounted in conformity with target models, so that boards conforming to each model can be produced. A need of constructing a production line corresponding to each model of printed boards is eliminated.

According to the board transferring apparatus 221 of this second embodiment, and the component mounting apparatus including the board transferring apparatus, when a plurality of component mounting apparatuses are arranged, coped with can be various production forms from a case where each of component mounting apparatuses 201 mounts all components to each unmounted board 7 to a case where the component mounting apparatuses 201 mount mutually different components. That is, controller 280 is enabled to control operation of board transferring apparatuses 221 and board carry-in devices 2212 to meet various production forms by designing supply-propriety information for component supply/mounting machines 210, which are described in carry-in propriety display parts 2216 of respective boards 7, 8 on a basis of a processing program which is performed by the controller 280 according to types and number of components to be mounted by the component mounting apparatuses 201 arranged along transfer direction 224, and production forms of these boards.

Although unmounted boards 7 transferred from an upstream side are equal ones as described above in the second embodiment, boards are not limited to this. Particularly, when a plurality of kinds of boards, e.g., four kinds of boards 7 are sequentially repeatedly transferred, a number of produced printed boards to be stocked can be made proper. Suppose that one appliance needs, for example, four kinds of printed boards A–D, in the conventional component mounting apparatus of FIG. 9, boards should be produced for every kind of board because the conventional apparatus cannot produce a plurality of kinds of boards in a mixed condition. Therefore, in order for manufacturing, e.g., 100 units of the appliance, 100 pieces of board "A" should be produced first, 100 pieces of board "B" should be produced next, and so on. In other words, a necessary number of boards should be produced sequentially for each kind.

On the other hand, in the component mounting apparatus of the present second embodiment, since boards A–D can be transferred in turn and supplied to respective component supply/mounting machines and then subjected to mounting operations, it is possible to produce in groups of boards A–D, that is, boards for every one set of the appliance can be produced. Thus, a number of printed boards to be stocked can be controlled to be proper as mentioned above.

In the embodiments shown in FIGS. 15–17, both the identifying device 2215 and the recognizing device 227 are equipped with the component mounting apparatus 2014 arranged at a trail end. However, the arrangement is not limited to this, and only the identifying device 2215 may be provided.

In the above second embodiment, transferred boards 7, 8 are temporarily stopped when carry-in propriety display part 2216 is identified by the identifying device 2215. However, this identifying operation can be performed without stopping the boards 7, 8 by equipping a different type of identifying device 2215, a moving mechanism for the identifying device 2215, or the like.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A board transferring apparatus for transferring boards between the board transferring apparatus and a first component-mounting board production apparatus, comprising:
    an unprocessed board transfer unit including
        (i) an unprocessed board transfer path along which an unprocessed board, as a board not yet processed by the first component-mounted board production apparatus, is to be transferred in a transfer direction, and
        (ii) an unprocessed board carry-in device operable to move between said unprocessed board transfer path and the first component-mounted board production apparatus so as to carry the unprocessed board into the first component-mounted board production apparatus;
    a process-finished board transfer unit including
        (i) a process-finished board transfer path along which a process-finished board, as a board processed by the first component-mounted board production apparatus, is to be transferred in the transfer direction, and
        (ii) a process-finished board send-out device that is different from said unprocessed board carry-in device and is operable to move between said process-finished board transfer path and the first component-mounted board production apparatus so as to carry the process-finished board out from the first component-mounted board production apparatus; and
    a shift device operable to move between said unprocessed board transfer path and said process-finished board transfer path so as to shift a board between said unprocessed board transfer path and said process-finished board transfer path.

2. The board transferring apparatus according to claim 1, further comprising:
    a controller for controlling operations of said unprocessed board transfer unit, said process-finished board transfer unit and said shift device.

3. The board transferring apparatus according to claim 2, wherein when a second component-mounted board production apparatus is arranged in series with the first component-mounted production apparatus along the transfer direction, with the first component-mounted board production apparatus and the second component-mounted board production apparatus being for performing different processes relative to one another,
    said shift device is positioned between the first component-mounted board production apparatus and the second component-mounted board production apparatus, and
    said controller is for controlling said shift device so as to shift the process-finished board, after being carried out from the first component-mounted board production apparatus to said process-finished board transfer path, to said unprocessed board transfer path.

4. The board transferring apparatus according to claim 3, wherein
    said controller is for controlling operations of said unprocessed board transfer unit, said process-finished board transfer unit and said shift device based on an arrangement of the first component-mounted board production apparatus and the second component-mounted board production apparatus along the transfer direction and a processing program to be executed for boards to be processed.

5. The board transferring apparatus according to claim 1, wherein
    said process-finished board send-out device and said shift device are separate from one another.

6. The board transferring apparatus according to claim 5, further comprising:
    a controller for controlling operations of said unprocessed board transfer unit, said process-finished board transfer unit and said shift device.

7. The board transferring apparatus according to claim 1, wherein
    said process-finished board send-out device and said shift device are constructed and arranged to shift the process-finished board to said unprocessed board transfer path after the process-finished board has been received on said process-finished board transfer path.

8. The board transferring apparatus according to claim 7, further comprising:
    a controller for controlling operations of said unprocessed board transfer unit, said process-finished board transfer unit and said shift device.

9. A component mounting apparatus comprising:
    a first component-mounted board production device;
    a board transferring device for transferring boards between the board transferring device and said first component-mounted board production device, said board transferring device including
        (i) an unprocessed board transfer unit having
            (a) an unprocessed board transfer path along which an unprocessed board, as a board not yet processed by said first component-mounted board production device, is to be transferred in a transfer direction, and
            (b) an unprocessed board carry-in device operable to move between said unprocessed board transfer path and said first component-mounted board production device so as to carry the unprocessed board into said first component-mounted board production device;
        (ii) a process-finished board transfer unit having
            (a) a process-finished board transfer path along which a process-finished board, as a board processed by said first component-mounted board production device, is to be transferred in the transfer direction, and
            (b) a process-finished board send-out device that is different from said unprocessed board carry-in device and is operable to move between said process-finished board transfer path and said first component-mounted board production device so as to carry the process-finished board out from said first component-mounted board production device; and a shift device operable to move between said unprocessed board transfer path, and said process-finished board transfer path so as to shift a board between said unprocessed board transfer path and said process-finished board transfer path.

10. The component mounting apparatus according to claim 9, further comprising:

controller for controlling operations of said unprocessed board transfer unit, said process-finished board transfer unit and said shift device.

11. The component mounting apparatus according to claim 10, further comprising:

a second component-mounted board production device arranged in series with said first component-mounted board production device along the transfer direction, with said first component-mounted board production device and said second component-mounted board production device being for performing different processes relative to one another, and with said shift device being positioned between said first component-mounted board production device and said second component-mounted board production device, wherein said controller is for controlling said shift device so as to so as to shift the process-finished board, after being carried out from said first component-mounted board production device to said process-finished board transfer path, to said unprocessed board transfer path.

12. The component mounting apparatus according to claim 11, wherein said first component-mounted board production device comprises a first supply/mounting machine operable to mount first components onto an unprocessed board, and said second component-mounted board production device comprises a second supply/mounting machine operable to mount second components onto an unprocessed board, and said controller is for controlling said unprocessed board transfer unit, said process-finished board transfer unit and said shift device so as to cause said first supply/mounting machine to mount the first components onto an unprocessed board, then cause this board to be carried into said second supply/mounting machine, and then cause said second supply/mounting machine to mount the second components onto this board.

13. The component mounting apparatus according to claim 11, wherein said process-finished board send-out device and said shift device are separate from one another.

14. The component mounting apparatus according to claim 13, wherein said first component-mounted board production device comprises a first supply/mounting machine operable to mount first components onto an unprocessed board, and said second component-mounted board production device comprises a second supply/mounting machine operable to mount second components onto an unprocessed board, and said controller is for controlling said unprocessed board transfer unit, said process-finished board transfer unit and said shift device so as to cause said first supply/ mounting machine to mount the first components onto an unprocessed board, then cause this board to be carried into said second supply/mounting machine, and then cause said second supply/mounting machine to mount the second components onto this board.

15. The component mounting apparatus according to claim 11, wherein said process-finished board send-out device and said shift device are constructed and arranged to shift the process-finished board to said unprocessed board transfer path after the process-finished board has been received on said process-finished board transfer path.

16. The component mounting apparatus according to claim 15, wherein said first component-mounted board production device comprises a first supply/mounting machine operable to mount first components onto an unprocessed board, and said second component-mounted board production device comprises a second supply/mounting machine operable to mount second components onto an unprocessed board, and said controller is for controlling said unprocessed board transfer unit, said process-finished board transfer unit and said shift device so as to cause said first supply/ mounting machine to mount the first components onto an unprocessed board, then cause this board to be carried into said second supply/mounting machine, and then cause said second supply/mounting machine to mount the second components onto this board.

17. The component mounting apparatus according to claim 9, wherein said process-finished board send-out device and said shift device are separate from one another.

18. The component mounting apparatus according to claim 9, wherein said process-finished board send-out device and said shift device are constructed and arranged to shift the process-finished board to said unprocessed board transfer path after the process-finished board has been received on said process-finished board transfer path.

19. A board transfer method comprising:

carrying an unprocessed board, as a board not processed by a first component-mounted board production apparatus, from an unprocessed board transfer conveyor into said first component-mounted board production apparatus;

sending out a process-finished board, as a board processed by said first component-mounted board production apparatus, from said first component-mounted board production apparatus to a process-finished board transfer conveyor which is different from said unprocessed board transfer conveyor; and moving said process-finished board from said process-finished board transfer conveyor to said unprocessed board transfer conveyor.

20. The board transfer method according to claim 19, wherein a second component-mounted board production apparatus is arranged in series with said first component-mounted board production apparatus along a transfer direction of said unprocessed board and said process-finished board, with said first component-mounted board production apparatus and said second component-mounted board production apparatus being for performing different processes relative to one another, said method further comprising:

after moving said process-finished board to said unprocessed board transfer conveyor, carrying said process-finished board into said second component-mounted board production apparatus.

21. The board transfer method according to claim 20, further comprising:

controlling
- (i) carrying of said unprocessed board from said unprocessed board transfer conveyor into said first component-mounted board production apparatus,
- (ii) moving of said process-finished board from said process-finished board transfer conveyor to said unprocessed board transfer conveyor, and
- (iii) carrying of said process-finished board into said second component-mounted board production apparatus, based on an arrangement of said first component-mounted board production apparatus and said second component-mounted board production apparatus along said transfer direction and a processing program to be executed for boards to be processed.

* * * * *

UNITED STATES PATENT AND TRADEMARK OFFICE
CERTIFICATE OF CORRECTION

PATENT NO. : 6,836,960 B2
DATED : January 4, 2005
INVENTOR(S) : Kurayasu Hamasaki et al.

It is certified that error appears in the above-identified patent and that said Letters Patent is hereby corrected as shown below:

Title page, Item [54] and Column 1, line 1,
Title, change "BOARD TRANSFER APPARATUS, BOARD TRANSFER METHOD, AND COMPONENT MOUNTING APPARATUS" to -- BOARD TRANSFERRING APPARATUS AND METHOD, AND COMPONENT MOUNTING APPARATUS --.

Column 33,
Line 14, insert -- a -- before "controller".

Signed and Sealed this

Twenty-fourth Day of May, 2005

JON W. DUDAS
*Director of the United States Patent and Trademark Office*